(12) United States Patent
Mandelman et al.

(10) Patent No.: US 6,518,670 B1
(45) Date of Patent: Feb. 11, 2003

(54) ELECTRICALLY POROUS ON-CHIP DECOUPLING/SHIELDING LAYER

(75) Inventors: Jack A. Mandelman, Stormville, NY (US); Ronald G. Filippi, Wappingers Falls, NY (US); Jeffrey P. Gambino, Westford, VT (US); Richard A. Wachnik, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/091,643

(22) Filed: Mar. 6, 2002

(51) Int. Cl.[7] ................................................ H01L 29/40
(52) U.S. Cl. ...................... 257/752; 257/774; 257/750; 257/763; 257/764; 257/758
(58) Field of Search ............................... 257/774, 758, 257/750, 763, 764, 769, 752; 438/652, 626, 631, 653, 927, 118, 622, 683, 685, 648, 656

(56) References Cited

U.S. PATENT DOCUMENTS

| | | | | |
|---|---|---|---|---|
| 5,285,017 A | * | 2/1994 | Gardner ....................... | 257/700 |
| 5,472,900 A | * | 12/1995 | Vu et al. ..................... | 438/396 |
| 5,668,399 A | * | 9/1997 | Cronin et al. ............... | 257/532 |
| 6,140,226 A | * | 10/2000 | Grill et al. .................. | 438/637 |
| 6,143,646 A | * | 11/2000 | Wetzel ....................... | 438/637 |
| 6,399,495 B1 | * | 4/2002 | Tseng et al. ................ | 438/687 |
| 6,239,459 B1 | * | 5/2002 | Al-Shareef et al. ......... | 257/296 |
| 6,239,022 B1 | * | 6/2002 | Seo et al. .................... | 438/629 |

* cited by examiner

Primary Examiner—Jasmine J B Clark
(74) Attorney, Agent, or Firm—Graham S. Jones, II; H. Daniel Schnurmann

(57) ABSTRACT

A semiconductor device includes interconnected conductor lines comprising a lower Interlayer Dielectric (ILD) layer having a top surface formed on a substrate. Several lower conductor lines are formed on the top surface of the lower ILD layer surrounded by an insulator formed on the lower ILD layer. Each of a set of resistive studs has sidewalls, a lower end and an upper end and it is joined to the top of the lower conductor line at the lower end. There are several intermediate conductor lines formed between the resistive studs separated from adjacent studs by a liner layer and a capacitor dielectric layer. Upper conductor lines are formed on a upper level. Each has a bottom surface in contact with a corresponding one of the resistive studs. A central ILD layer is formed below the intermediate conductor to electrically insulate and separate the intermediate conductor lines from the lower conductor lines. A upper ILD layer overlies the intermediate conductor for electrically insulating and separating the intermediate conductor lines from the upper conductor lines. The resistive stud, the capacitor dielectric, and the intermediate conductor across the capacitor dielectric layer and the liner layer form an electrically porous, distributed resistive-capacitive low-pass decoupling network.

20 Claims, 26 Drawing Sheets

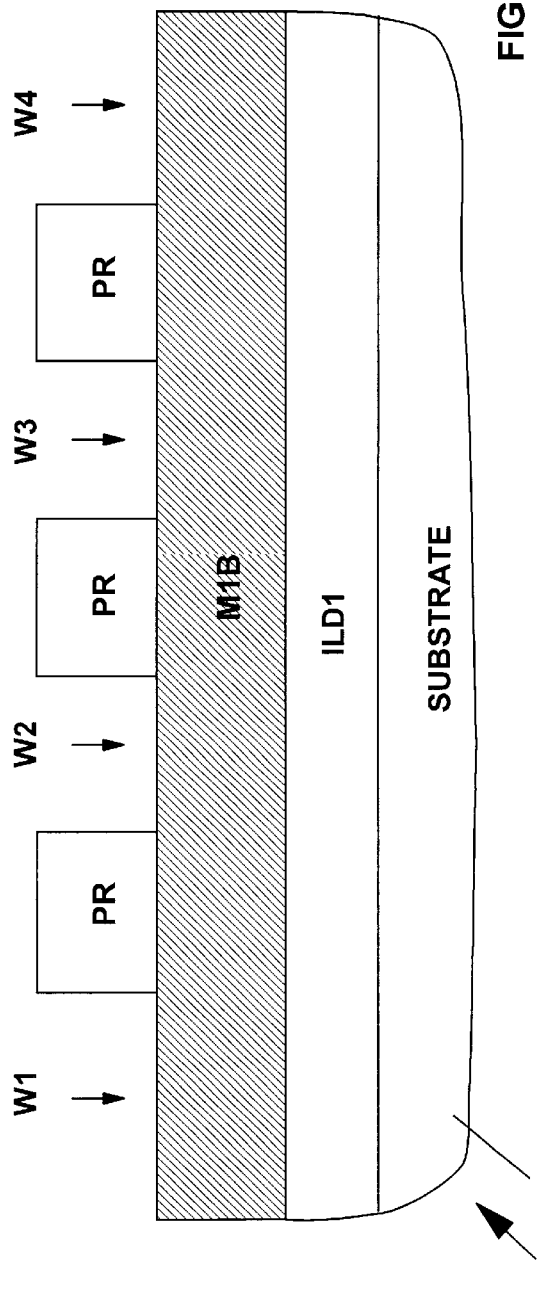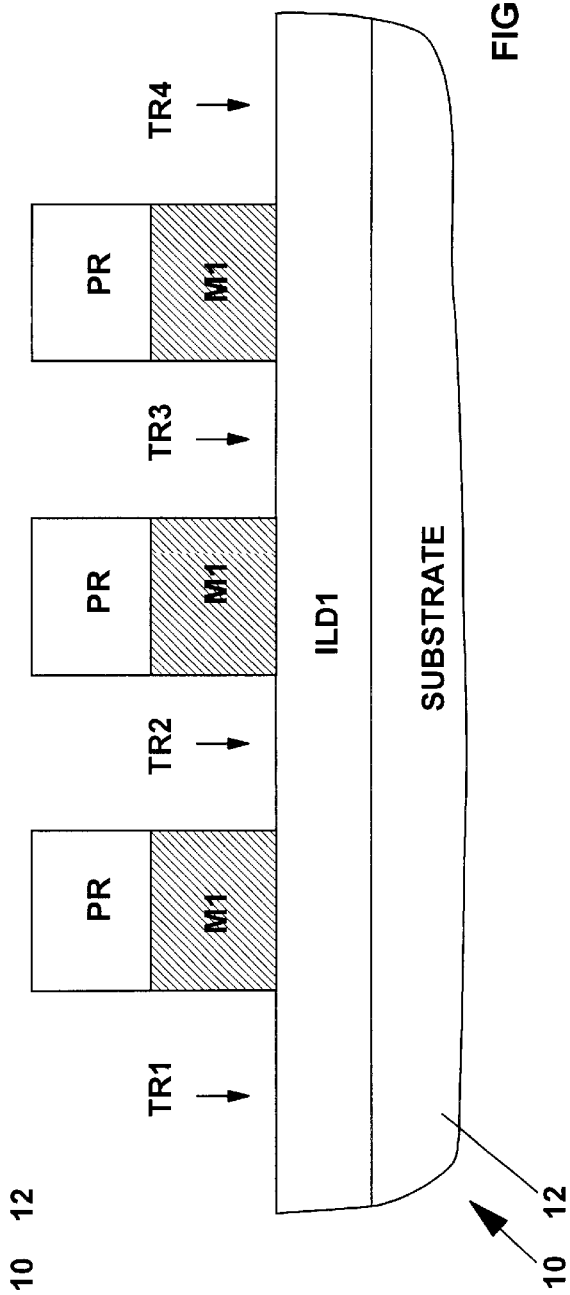

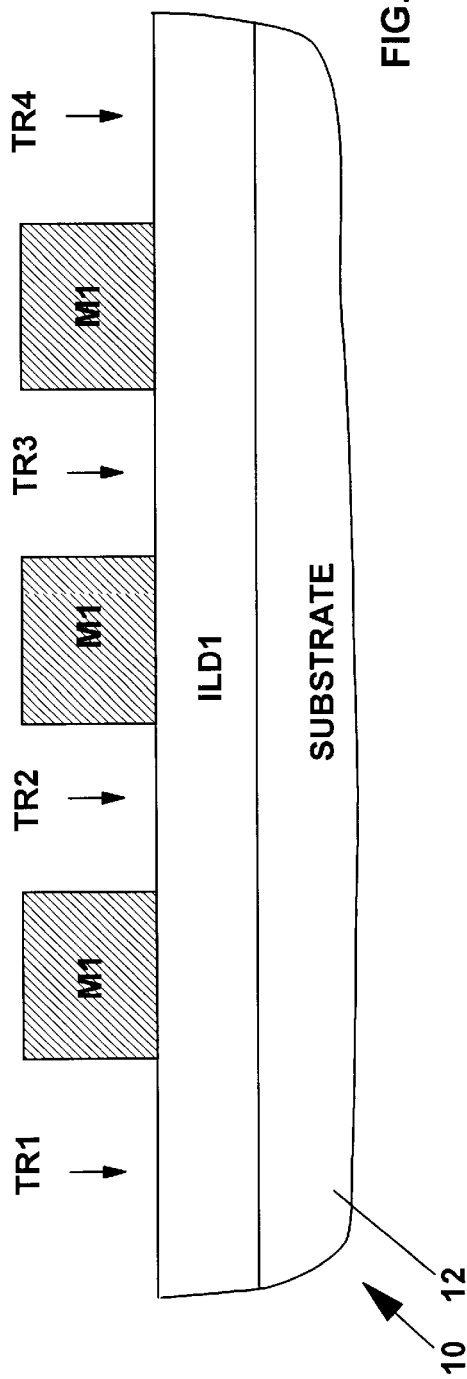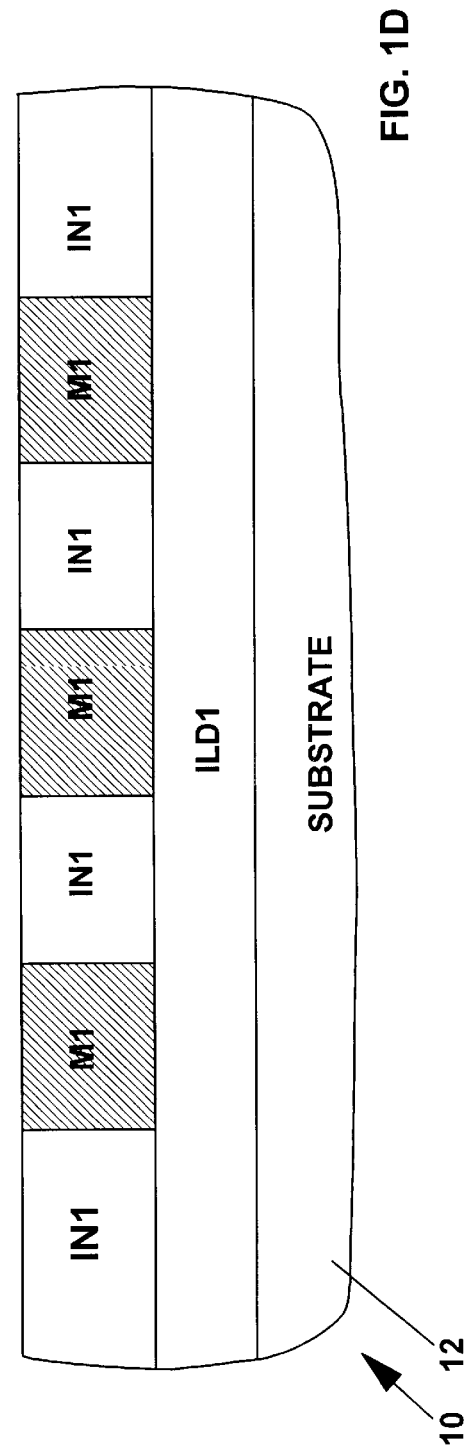

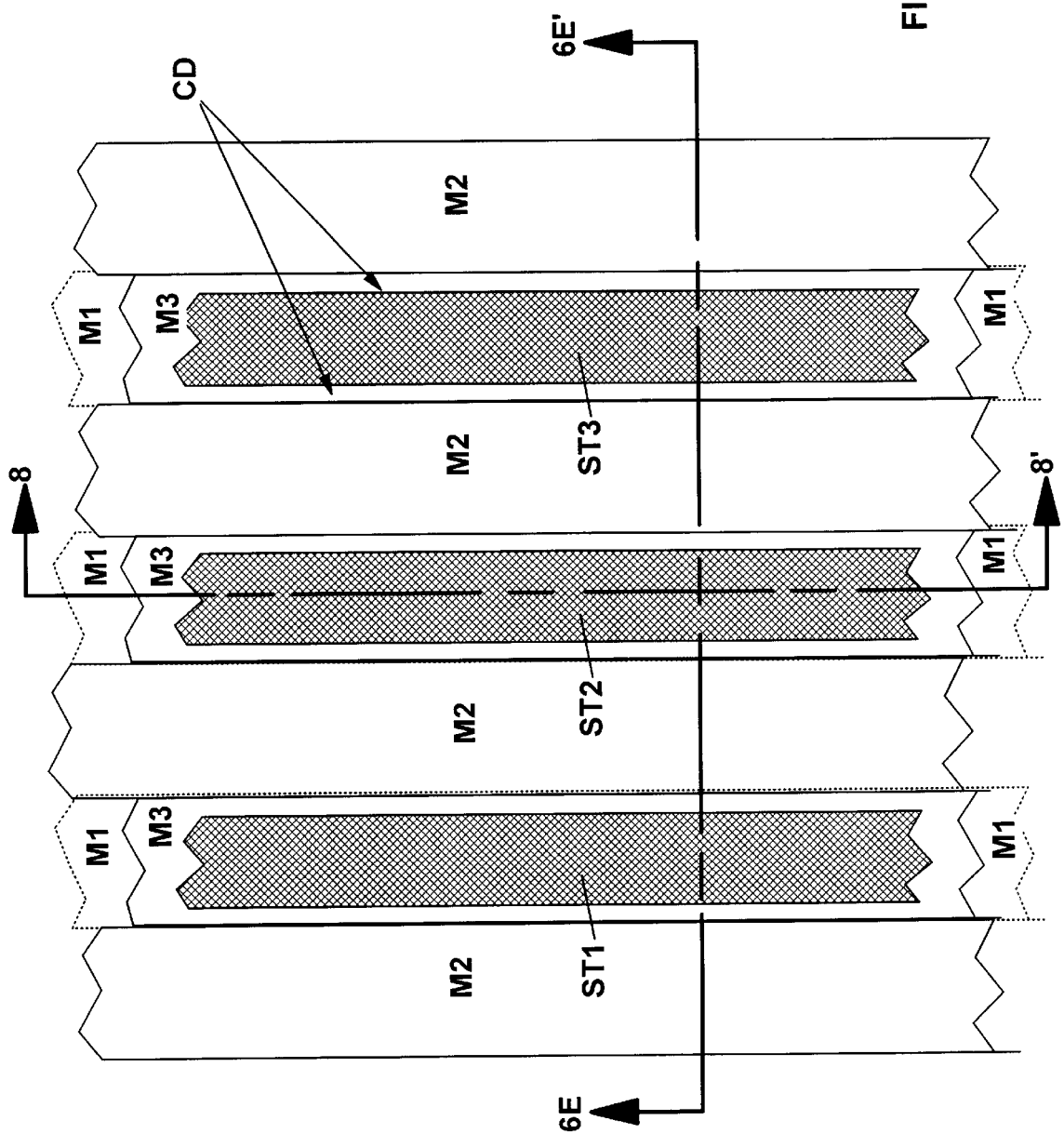

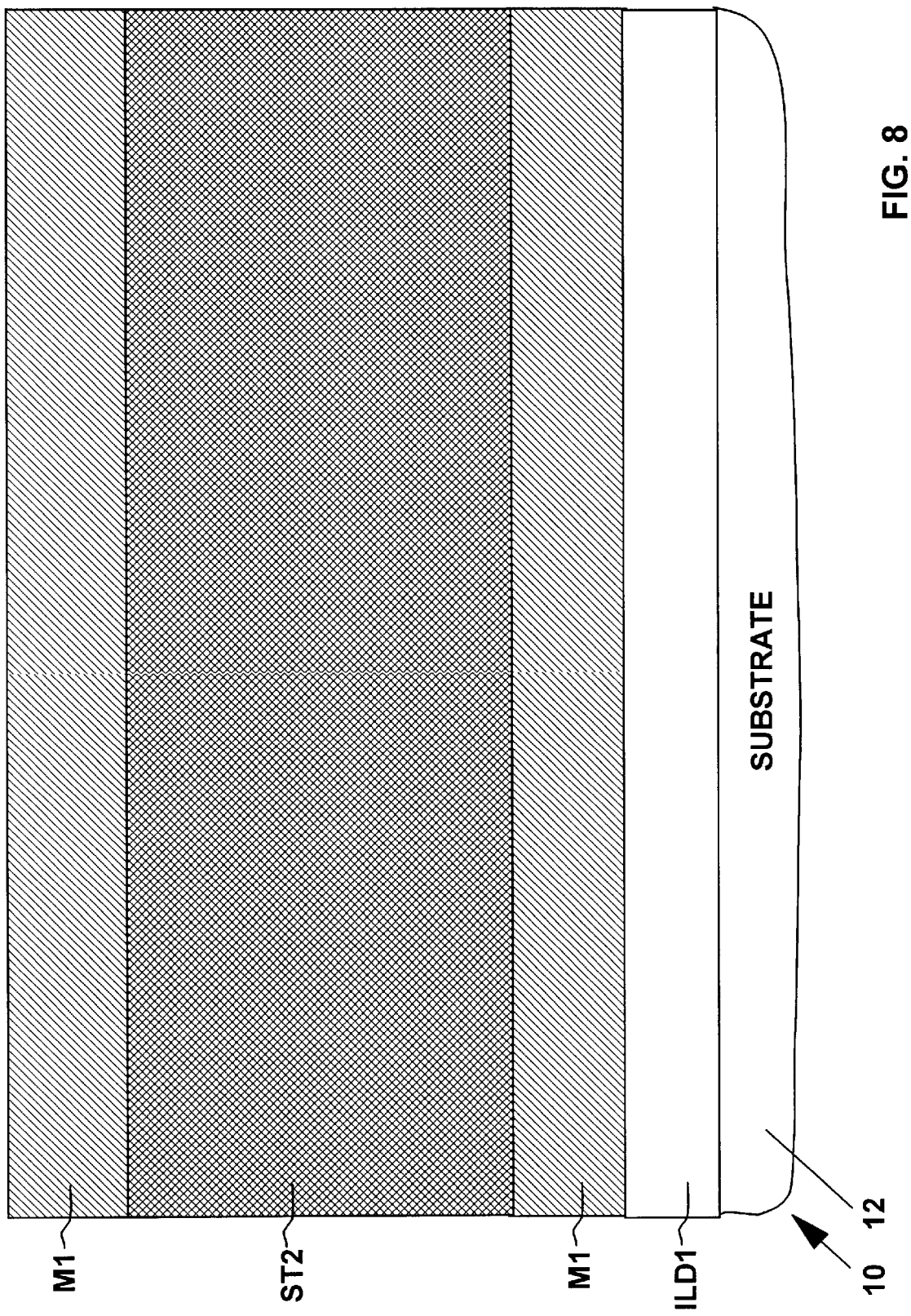

ELECTRICALLY POROUS ON-CHIP DECOUPLING/SHIELDING LAYER

BACKGROUND OF THE INVENTION

1. Field of the Invention

This invention relates to semiconductor devices and more particularly to providing protection of conductors on a semiconductor device from interference caused by digital switching noise or other unwanted transient signals.

2. Description of Related Art

A challenge encountered in System-On-Chip (SOC) mixed signal applications is the problem of isolating digital switching noise from small signal analog circuits. It is essential that transient noise signals induced by switching waveforms be kept out of small signal analog circuits, to avoid modulation or pumping of the analog functions by the digital waveform.

In another environment, RF analog single chip applications require that various sections of the chip be isolated from one another.

For example, in most devices RF energy in one circuit needs to be prevented from coupling into adjacent RF circuits, either at the same frequency or at different frequencies, when such coupling of RF energy can lead to undesired mixing products and spurious responses. In single chip designs employing RF power amplifiers, feedback from the output amplifier to lower signal level circuits must be avoided.

In yet another example, in DRAM (Dynamic Random Access Memory) and eDRAM (embedded-DRAM) applications, noise in sense amplifier regions must be minimized. This is especially true with open bitline architectures, since common mode noise rejection provided by the folded bitline architecture is not realized. Advanced DRAM cell layouts of $6F^2$ area or less do not provide for folded bitline architecture with a single bitline wiring level. For such DRAM and eDRAM designs, the present invention provides for reduced coupling noise in the sense amplifier circuits.

Well known conventional approaches for decoupling and shielding circuits from each other rely on fabricating discrete decoupling capacitors in the silicon substrate such as gate oxide capacitors or trench capacitors and by employing layouts which increase the distance between a sensitive circuit and sources of noise. Accordingly, decoupling capacitors have been formed within metal wiring levels in the past. However, since the decoupling capacitors have been formed by discrete elements, there is an excessive concentration of the capacitance at specific points in the structure. Moreover, no distributed resistors are included in the structures, and no resistance intentionally incorporated into the capacitive structures.

U.S. Pat. No. 5,285,017 of Gardner describes "Embedded Ground Plane and Shielding Structures Using Sidewall Insulators in High Frequency Circuits Having Vias," wherein a metallic shielding layer is formed between two adjacent metal wiring levels, but no attempt is made to enhance the interlayer capacitance to improve the decoupling effect.

U.S. Pat. No. 5,472,900 of Vu et al. entitled "Capacitor Fabricated on a Substrate Containing Electronic Circuitry" teaches a structure including a decoupling capacitor formed between two metallic capacitor plates that were deposited within the wiring layers above the semiconductor substrate. The decoupling capacitance is achieved by providing a discrete thin silicon dioxide ($SiO_2$) layer formed on horizontal surfaces between the two plates. Since no series resistance is integrated into the structure to improve the decoupling effect at lower frequencies, discrete resistors would need to be formed within the silicon substrate to achieve a modest improvement in the decoupling effect.

Commonly assigned U.S. Pat. No. 5,668,399 of Cronin et al. entitled "Semiconductor Device with Increased On-Chip Decoupling" describes a decoupling capacitor structure formed of a set of horizontal, parallel plates separated by a thin dielectric.

See commonly assigned U.S. Pat. No. 6,140,226 of Grill et al. for "Dual Damascene Processing for Semiconductor Chip Interconnects".

SUMMARY OF THE INVENTION

An object of this invention is to provide an improved decoupling effect in electronic integrated circuit devices.

Another object of this invention is to provide improved metal wiring between levels on a chip.

Another object of this invention is to form Resistive-Capacitive (RC) decoupling networks in the closest possible proximity to the locations where they are required in electronic-integrated circuit devices.

Glossary

Electrical porosity—a structure is electrically porous when there is an array of electrical conductors which extend through the dielectric structure that permit electric current to flow through many "pores" in the structure. The array of electrical conductors can include an array of resistive studs or the like which pass or extend down through the dielectric structure permitting the electrical current to flow through the electrical-pores as a fluid flows through mechanical pores.

In accordance with this invention, distributed resistance and capacitance are formed between two metal wiring levels on a chip.

Further in accordance with this invention, a distributed RC decoupling network is integrated between two metal wiring levels on a chip.

Accordingly, an electrically porous structure is formed in accordance with this invention providing reduced noise among adjacent circuits, thereby enabling closer placement of circuit functions and higher overall density.

This invention differs from the prior art described above in that it provides a structure and method for fabricating a electrically-porous decoupling/shielding layer between upper and lower on-chip bus wiring layers. The invention achieves enhanced decoupling capacitance by forming an integrated, distributed capacitor-resistor structure on the sidewall surfaces of a conductor lying between the top wiring layers and bottom wiring layers. The structure and process is amenable to integration with dielectric materials having permittivity higher than $SiO_2$, e.g. silicon-nitride ($Si_3N_4$), tantalum pentoxide ($Ta_2O_5$), zirconium oxide ($Zr_2O_5$), aluminum oxide ($Al_2O_3$) and barium strontium titanate ($BaSrTiO_3$).

In summary, in accordance with this invention the sidewalls of a wiring level include distributed capacitance and resistance integrated into the sidewall structures to form distributed, integrated resistance-capacitance filter devices which preferably provide the improvement of electrical porosity.

Furthermore, since the structure of this invention integrates a resistive element within the structure forming the capacitor, an integrated, distributed RC network circuit is achieved. Such a distributed RC network circuit provides for decoupling and shielding which is more effective than the existing art because the noise and interference signals are filtered within very close proximity to the location which is the source of the disturbances which generate the noise and interference signals.

In accordance with this invention, a semiconductor device with interconnected conductor lines includes a plurality of lower conductor lines formed on a lower level each having a top surface and a plurality of resistive studs with sidewalls, lower ends and upper ends. Each resistive stud is formed over the top surface of a lower conductor line in electrical and mechanical contact therewith at the lower end thereof. A plurality of intermediate conductor lines are formed laterally between the resistive studs, with each intermediate conductor line being separated from each adjacent stud by a capacitor dielectric layer. A plurality of the upper conductor lines formed on a upper level each having a lower surface in contact with the upper end of a corresponding one of the resistive studs. Dielectric material is formed about the intermediate conductor for electrically insulating and separating the intermediate conductor lines from the lower conductor lines and the upper conductor lines.

In accordance another aspect of this invention a semiconductor device included interconnected conductor lines. A lower Interlayer Dielectric (ILD) layer has a top surface formed on the substrate. A plurality of lower conductor lines are formed on the top surface of the lower ILD layer and are surrounded by an insulator layer which is also formed on the top surface of the lower ILD layer, each of the lower conductor lines and the insulator layer having a top surface. A plurality of resistive studs have sidewalls, lower ends and upper ends. Each resistive stud is formed over the top surface of lower conductor line in electrical and mechanical contact therewith at the lower end thereof. A plurality of intermediate conductor lines are formed laterally between the resistive studs. Each intermediate conductor line is separated from each adjacent stud by a liner layer and a capacitor dielectric layer. A plurality of upper conductor lines are formed on a upper level each having a lower surface in contact with the upper end of a corresponding one of the resistive studs. A central ILD layer below the intermediate conductor electrically insulates and separates the intermediate conductor lines from the lower conductor lines. An upper ILD layer above the intermediate conductor electrically insulates and separates the intermediate conductor lines from the upper conductor lines.

Preferably, each resistive stud is formed from a material selected from the group consisting of tungsten, tungsten silicide and doped polysilicon; each resistive stud is separated from the capacitor dielectric layer by a liner layer composed of a material selected from the group consisting of titanium nitride and tantalum silicon nitride; and the capacitor dielectric layer is composed of a material selected from the group consisting of tantalum pentoxide and silicon nitride.

Preferably the second conductive line has a high aspect ratio.

Preferably the capacitor formed by the resistive stud, the capacitor dielectric, and the intermediate conductor across the capacitor dielectric layer and the liner layer form an electrically porous distributed resistive-capacitive low-pass decoupling network.

BRIEF DESCRIPTION OF THE DRAWINGS

The foregoing and other aspects and advantages of this invention are explained and described below with reference to the accompanying drawings, in which:

FIGS. 1A–1D show a subtractive process including forming a first ILD layer, forming a blanket metallization layer for the lower wiring, subtractively patterning and etching the blanket metallization to form the lower wiring lines, forming an insulation layer therebetween and planarizing the device to prepare it for production starting with the alternative processing steps illustrated by FIGS. 3 and 4A–4B.

FIG. 5 also shows the device of FIG. 4B after the central ILD layer has been etched back using the intermediate wiring lines as masks to form slots therebetween in the central ILD layer, between the metallic, intermediate lines.

FIG. 7 shows an "x-ray" plan view of the device shown in FIG. 6E with only the metal structures visible.

FIG. 8 is a sectional elevational view of device 10 of FIG. 6E taken along line 8—8' in FIG. 7 showing device with the substrate covered by the first ILD layer, upon which a lower line is shown covered by the stud which is covered in turn by the corresponding upper line.

DESCRIPTION OF THE PREFERRED EMBODIMENTS

Devices formed including an electrically porous on-chip decoupling/shielding layer RC network formed in accordance with this invention and process steps in accordance with this invention for forming those devices are described below.

Figure 5:
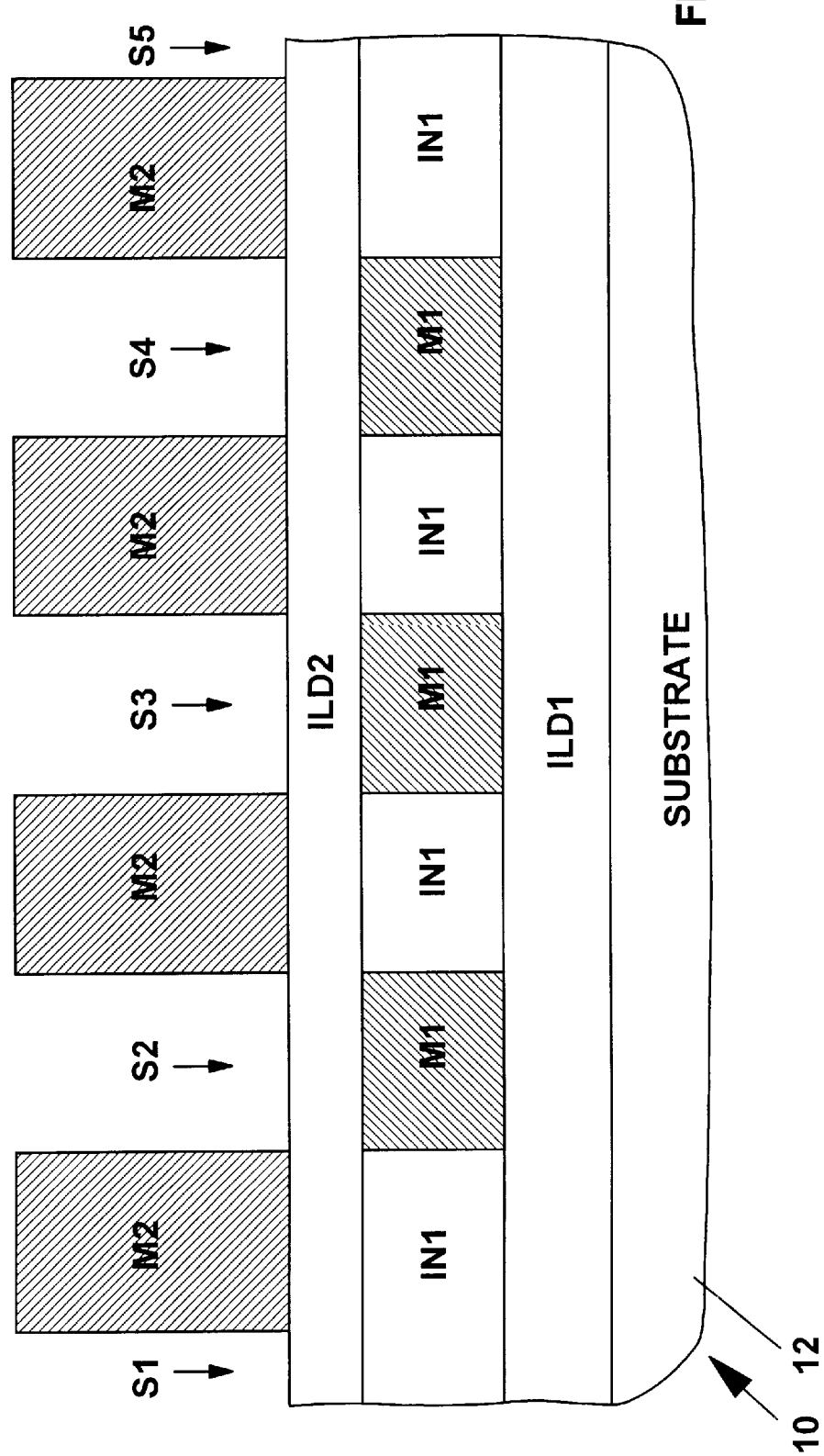
FIG. 5 shows the device of FIG. 3 after the mask has been stripped leaving the parallel stripes of intermediate wiring lines exposed with the parallel slots therebetween.
Figure 6A:
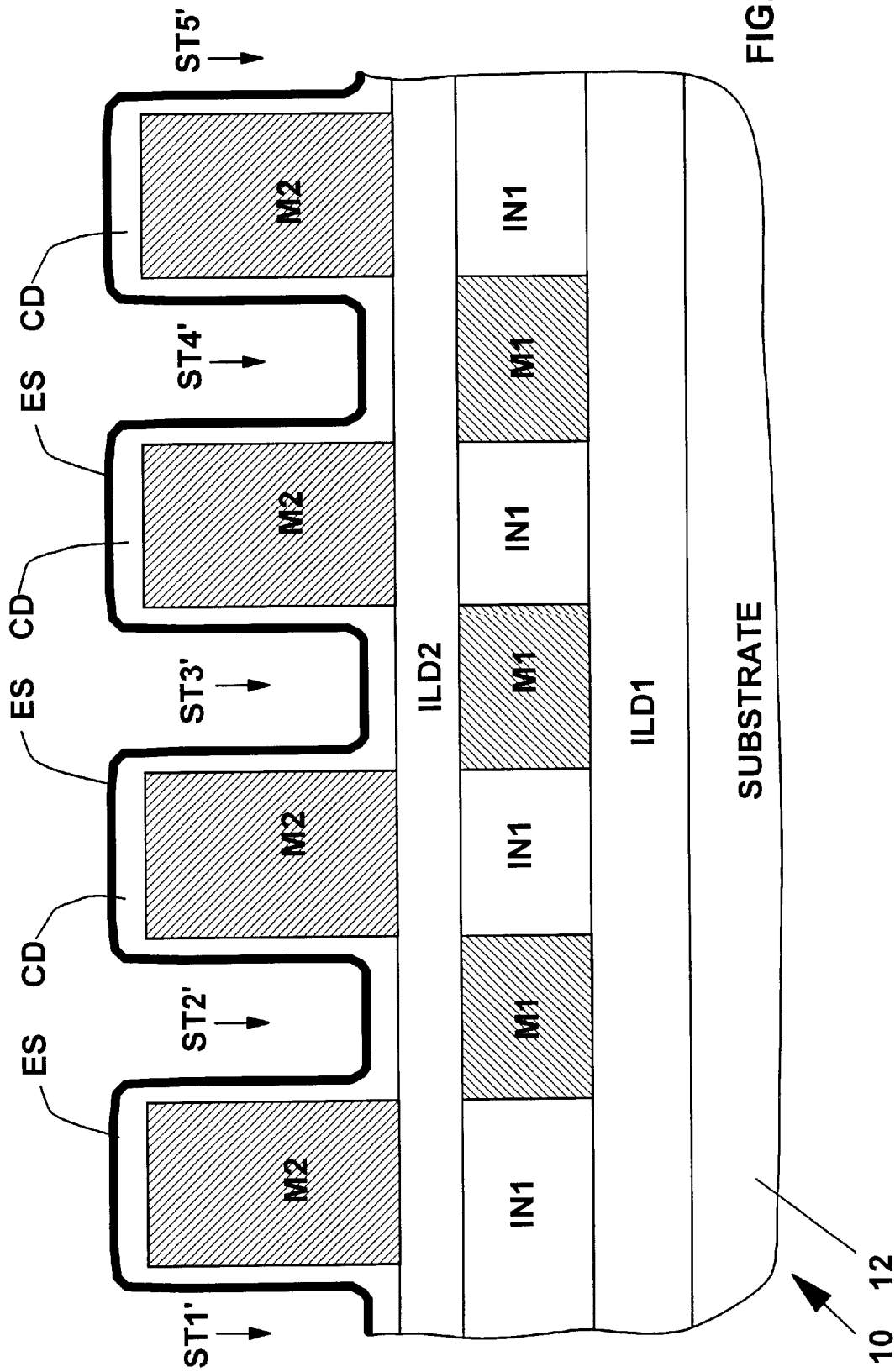
FIGS. 6A–6E describe the process of forming additional structures in accordance with this invention on top of the device 10 shown in FIG. 5.
Figure 6B:
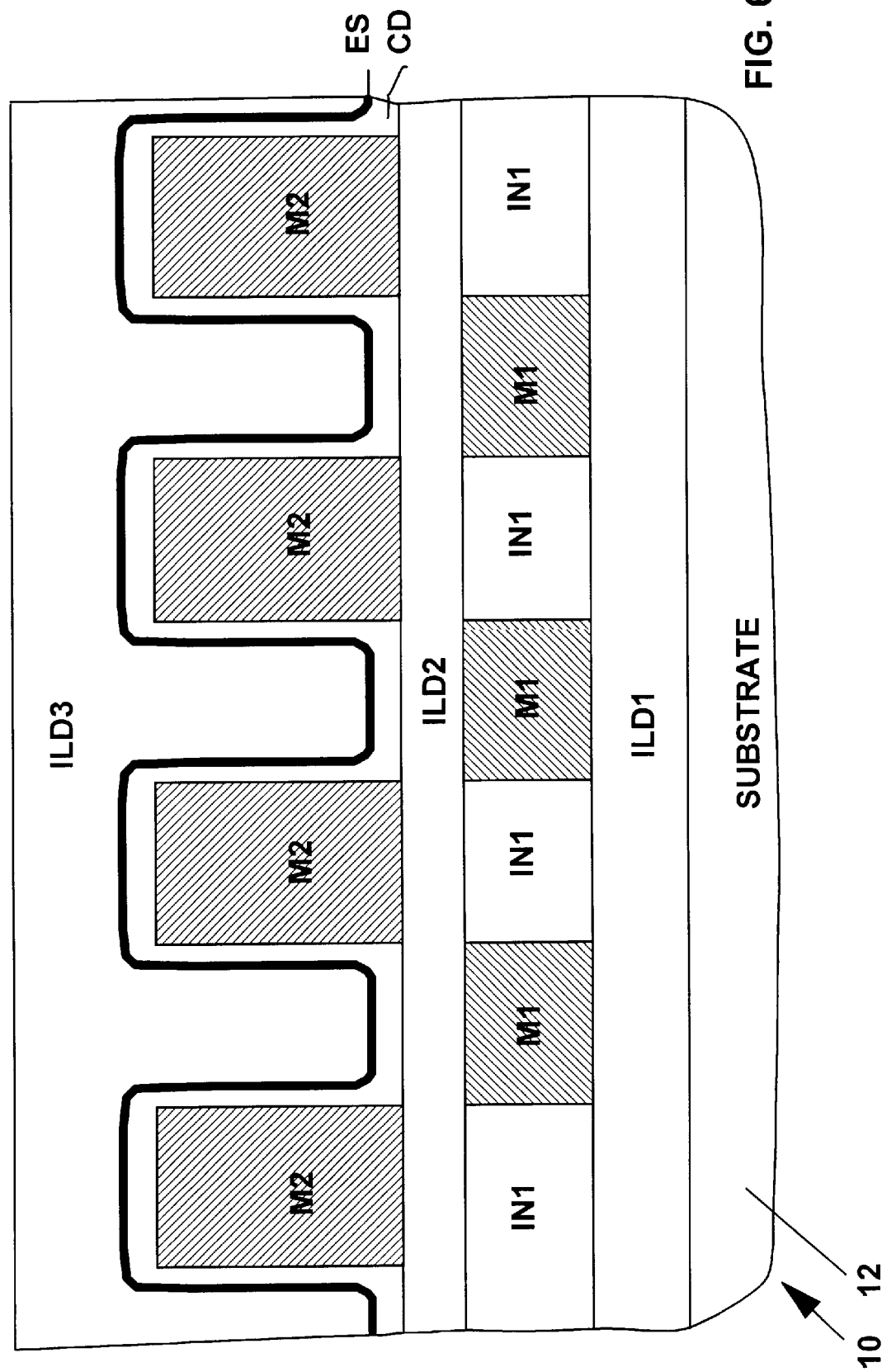
Figure 6C:
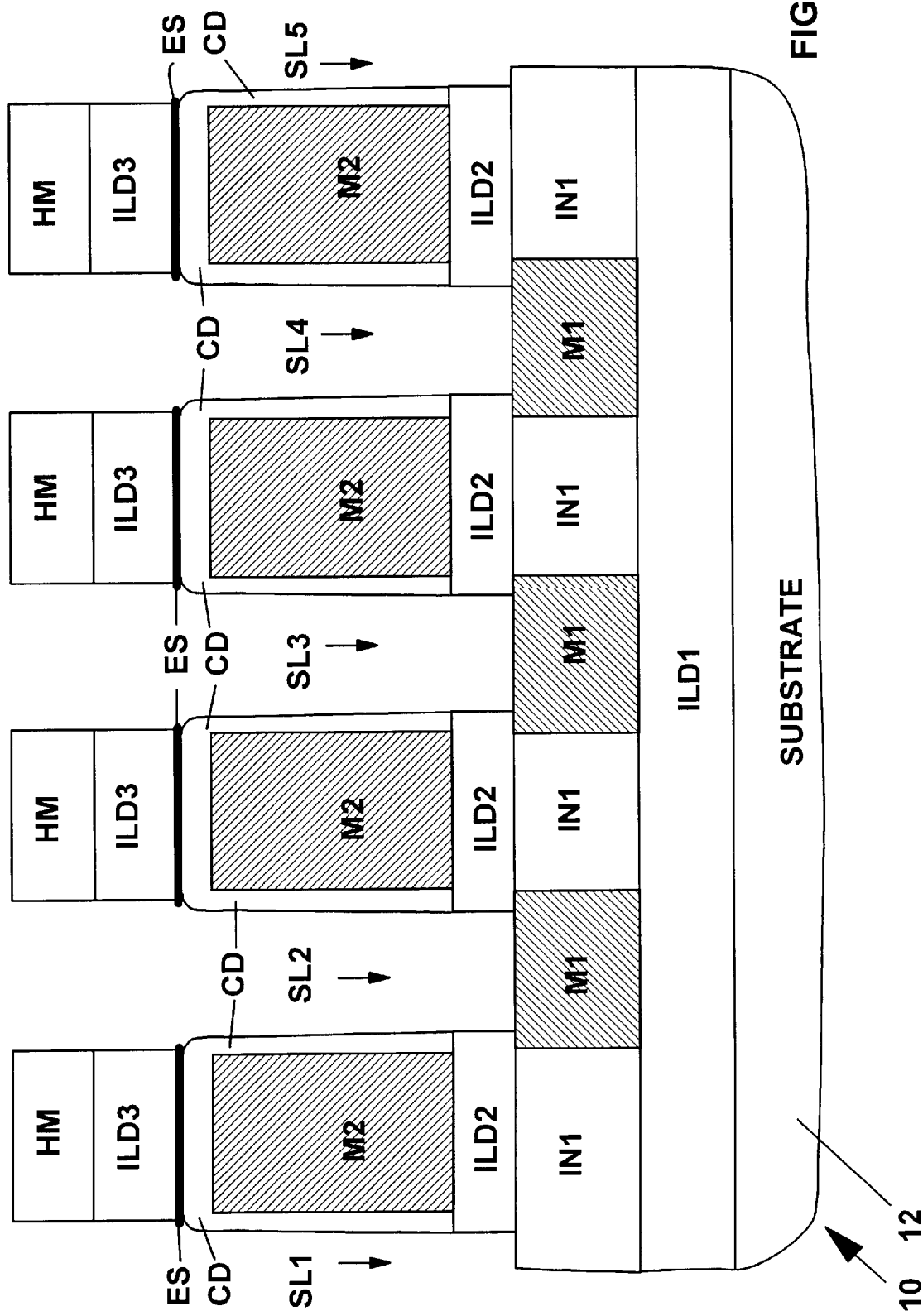
Figure 6D:
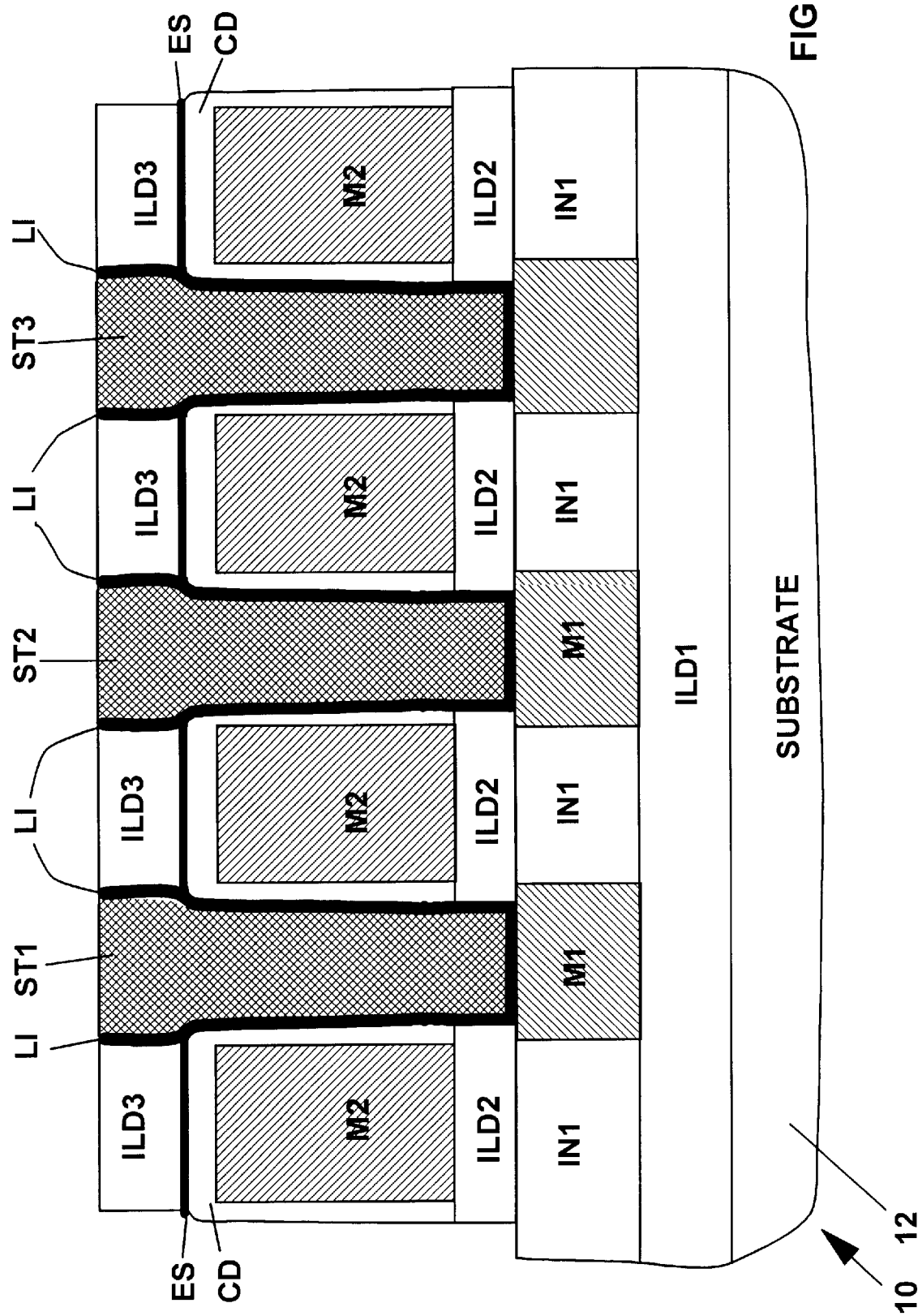
Figure 6E:
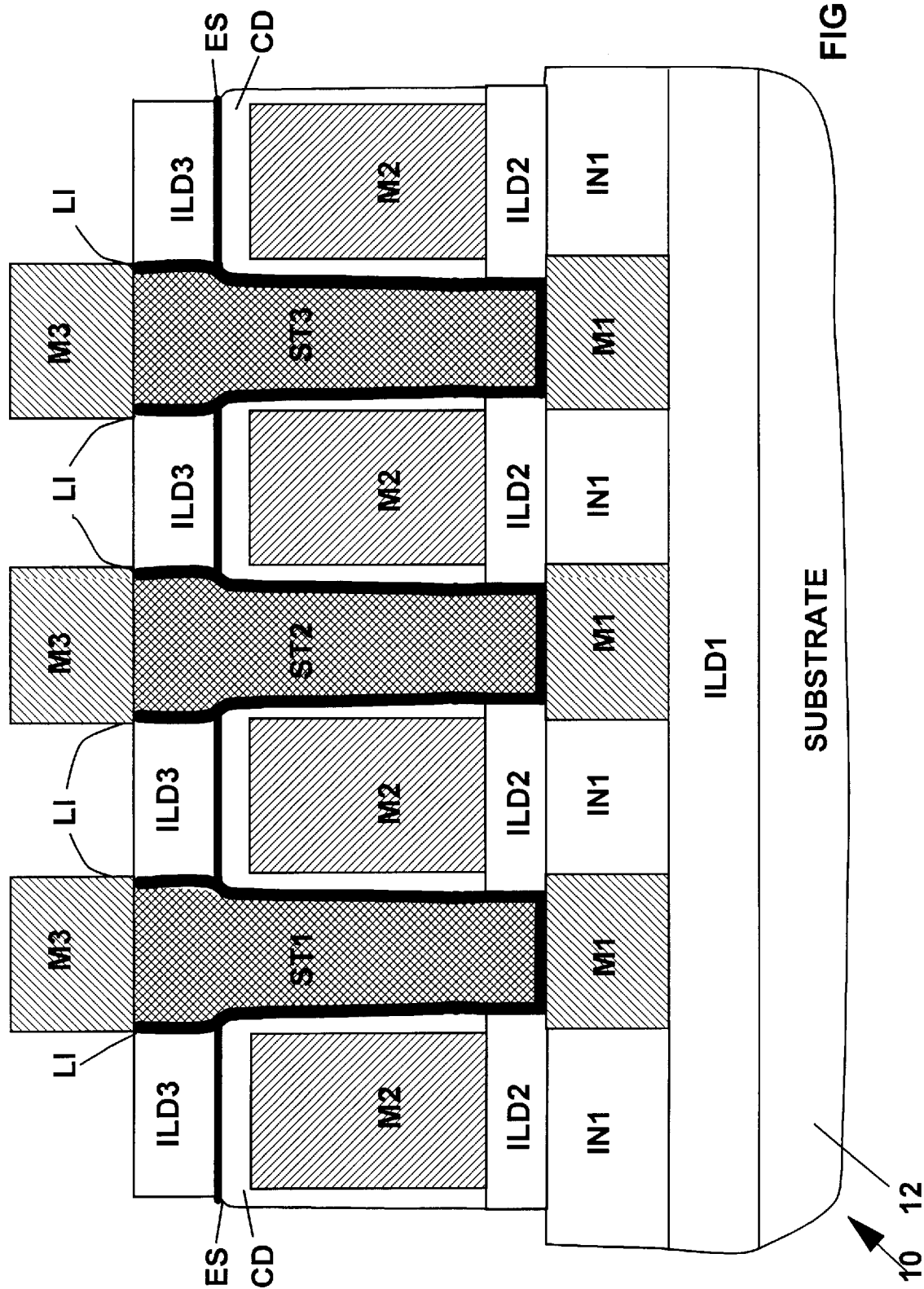

FIG. 6E shows a first embodiment of an electrically-porous on-chip decoupling/shielding layer in a System-On-Chip (SOC) device 10 in accordance with this invention. FIGS. 1A–1D, 2A–2B, 3, 4A–4B, 5, 6A–6E show a sequence of process steps for forming the device 10 on a substrate 12. The substrate 12 may consist of a silicon semiconductor substrate upon which electrical wiring layers (not shown) have been formed.

Figure 2A:
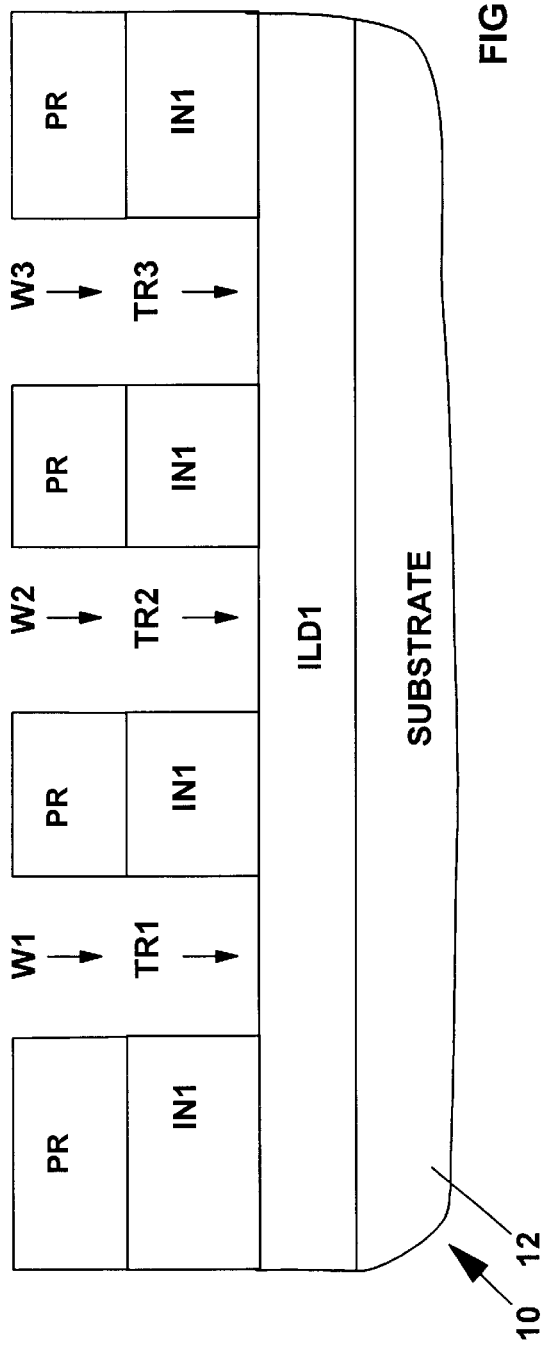
FIGS. 2A–2B show a damascene process including forming a first ILD layer, forming an insulation layer, patterning the insulation layer into trenches between stripes of the insulation layer, then depositing the lower wiring lines into the trenches and then planarizing the device to prepare it for production starting with the alternative processing steps illustrated by FIGS. 3 and 4A–4B.
Figure 2B:
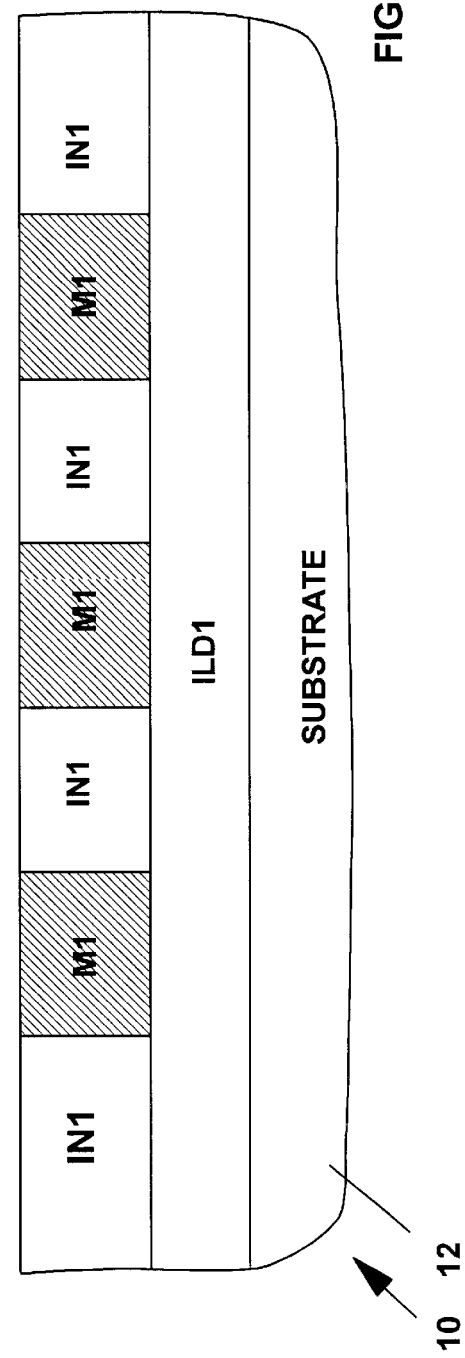
Figure 3:
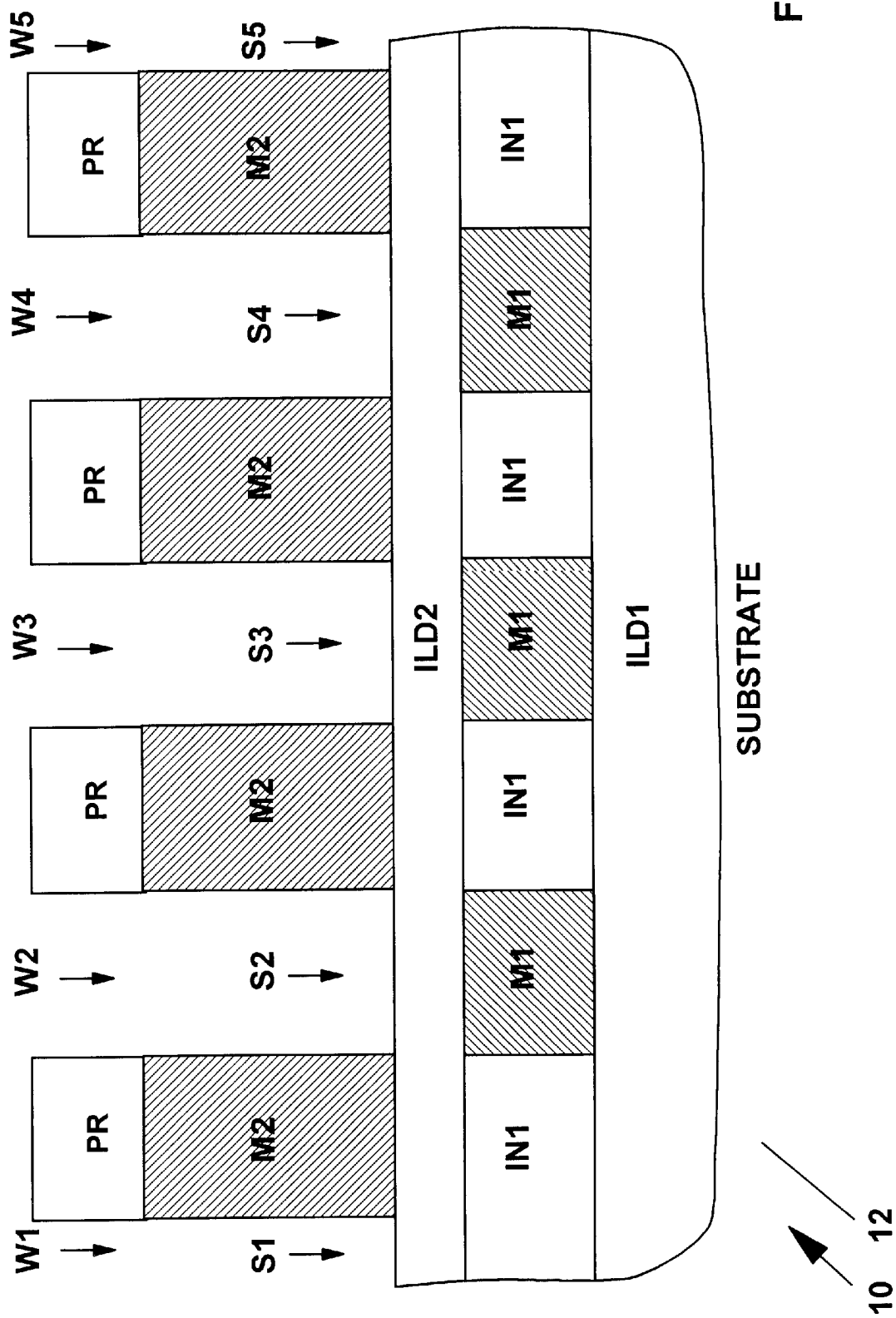
FIG. 3 shows the result of forming a planarized, blanket, central ILD layer covering the devices of either of FIGS. 1B and 2D, then depositing an intermediate metal layer over the central ILD layer, and forming a mask spaced apart by windows therethrough aligned with the lower wiring lines which reach back into the page over the intermediate metal layer, followed by etching slots through the intermediate metal layer down to the central ILD layer.
Figure 4A:
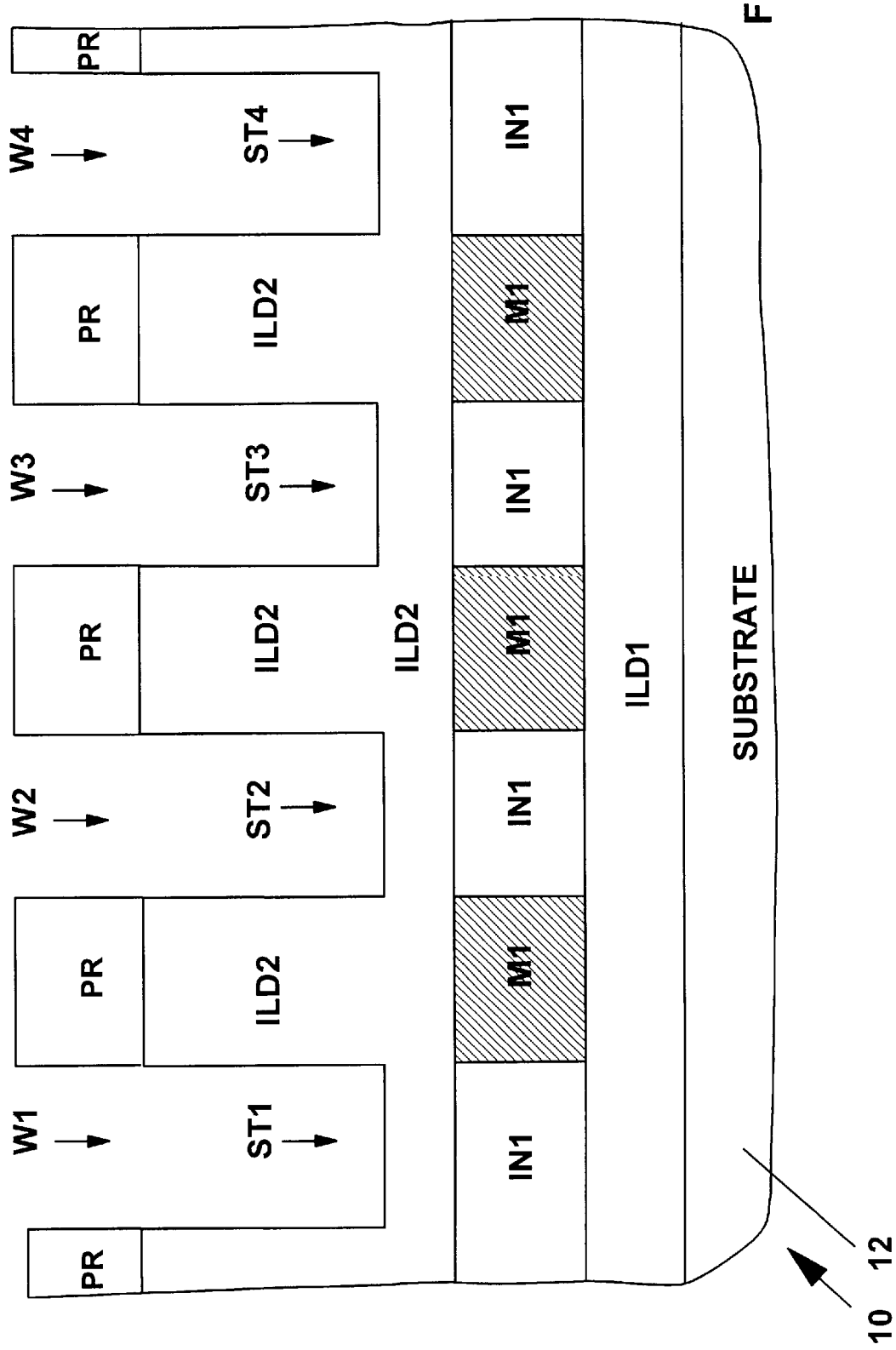
FIG. 4A shows a central ILD layer deposited over the lower lines and the first insulator layer of FIGS. 1B and 2D, which has been planarized, followed by forming a mask with openings therethrough which has been used to form trenches etched in the central ILD layer leaving a substantial thickness thereof at the bottom of the trenches to provide electrical separation of the lower lines from the intermediate lines to formed in FIG. 4B.

FIGS. 1A–1D and FIGS. 2A–2B show two sets of alternative initial processing steps for commencing the manufacture of device 10 in accordance with the method of this invention to provide the device 10 ready for introduction into the processing steps illustrated by FIG. 3 or FIG. 4A. In the case of both FIG. 1A and FIG. 2A the first steps of the process begin by forming a blanket lower ILD (ILD) layer ILD1 on top of the substrate 12 using conventional methods.

Then a set of parallel, first metal wiring lines M1 (referred to hereinafter as lower lines M1) which are alternating arrays of parallel stripes and a set of first insulator (dielectric) stripes IN1 are formed on the top of the lower ILD layer ILD1, using conventional methods. Lower lines M1 may be formed by well known subtractive etching processes as shown by FIGS. 1A and 1B. Alternatively the lower lines M1 are formed by a damascene etching processes as shown in FIGS. 2A and 2B after the lower ILD layer (ILD1) has been formed.

First Metal Layer Subtractive Etch Process

FIG. 1A shows the device 10 after forming a blanket first metal layer M1B over the lower ILD layer ILD1 followed by forming a photoresist mask of parallel strips PR reaching back into the page (with parallel windows W1–W4 also reaching back into the page therebetween) over the first metal layer M1B.

Then, as shown in FIG. 1B, the next step is to use the mask PR to perform a subtractive etch process such as Reactive Ion Etching (RIE) to etch parallel trenches TR1–TR4 which reach back into the page through the blanket layer M1B down to the top surface of the first interlevel layer ILD1 to form a set of parallel, lower lines M1 shown in FIG. 1B. The lower lines M1 also reach back into the page in the shape of parallel stripes between the parallel trenches TR1–TR4.

FIG. 1C shows the device 10 after removing the mask PR with the set of parallel trenches TR1–TR4 between the parallel lower lines M1.

FIG. 1D shows the device 10 after filling the trenches TR1–TR4 by depositing a first insulator (dielectric) layer IN1 to form first insulator (dielectric) stripes IN1 therein which also reach back into the page in the shape of parallel stripes between the lower lines M1., followed by the step of planarizing the device 10 to the same level as the lower lines M1.

First Metal Layer Damascene Etch Process

In accordance with the damascene etch process, FIG. 2A shows the device 10 after what was a blanket first insulator layer IN1 had been formed over lower ILD layer ILD1 and patterned with a photoresist mask of parallel strips PR reaching back into the page (with parallel windows W1–W3 therethrough, also reaching back into the page therebetween) over the first insulation layer IN1.

In the next step of the damascene process, an array of parallel strips of the first insulation layer IN1 was formed by etching through windows W1–W3 through the photoresist mask PR to form a parallel array of trenches TR1–TR3 through first insulation layer IN1 down to the lower ILD layer ILD1 also reaching back into the page.

FIG. 2B shows the device 10 of FIG. 2A after the trenches TR1–TR3 have been filled with parallel strips of metal to form lower lines M1 which also reach back into the page. The following step was to planarize the top surface of the device 10.

After either the subtractive Etch Process FIGS. 1A–1D which show the subtractive etch option, or the damascene etch process of FIGS. 2A–2B, a second set of parallel intermediate lines M2 ( hereinafter referred to as intermediate lines M2) are formed. Again there are two alternative processes for forming the second metal wiring lines including the subtractive etch option shown by FIG. 3 or the damascene option shown by FIGS. 4A and 4B.

Second Metal Layer Subtractive Etch Option

FIG. 3 shows the results of the sequence of steps of the subtractive etch option for forming the intermediate lines M2 from a blanket metallization layer M2B which starts in FIG. 3 with the step of depositing a blanket, central ILD layer ILD2 covering the top surface of the parallel stripes of the lower lines M1 and the parallel stripes of the first insulation layer IN1. Then the central ILD layer ILD2 was planarized. Next, the thick blanket second metal (M2) wiring layer was is formed on top of the planarized ILD2 layer. Then, another photoresist mask PR with spaced apart by windows W1–W5 therethrough which reach back into the page, is formed over the second metal wiring layer M2B. The windows W1–W5 are located directly above the array of lower lines M1. Parallel photoresist stripes of the mask PR are directly above and aligned with the parallel stripes of the first insulator (dielectric) layer IN1. Next a set of intermediate lines M2 are formed in the form of parallel wiring stripes. The intermediate lines M2 are formed by anisotropically etching through the windows W1–W5 to form slots S1, S2, S3, S4, and S5, that reach down through the intermediate metal lines M2 down to the central ILD layer ILD2. Thus the slots S1, S2, S3, S4, and S5 are located aside from and between the metallic, intermediate lines M2 are aligned directly above the stripes of lower lines M1 and also reach back into the page. Note that the intermediate lines M2 are directly above and aligned with the parallel stripes of the first insulator (dielectric) layer IN1.

It is desirable for the intermediate lines M2 to have a high aspect ratio (i.e. greater than 2:1) to enhance the sidewall surface area of the intermediate lines M2 relative to the available horizontal layout area. The intermediate lines M2, which will serve as conductors, are composed of a metallic conductor, e.g. aluminum, copper, gold, silver, tungsten or alloys thereof and may be clad with a conductive barrier layer, such as titanium (Ti), tantalum (Ta), tantalum nitride (TaN), or tantalum/ tantalum nitride (Ta/TaN) ( (not shown) for improved process compatibility with a conformal capacitor dielectric to be formed subsequently.

Second Metal Layer Damascene Option

Figure 4B:
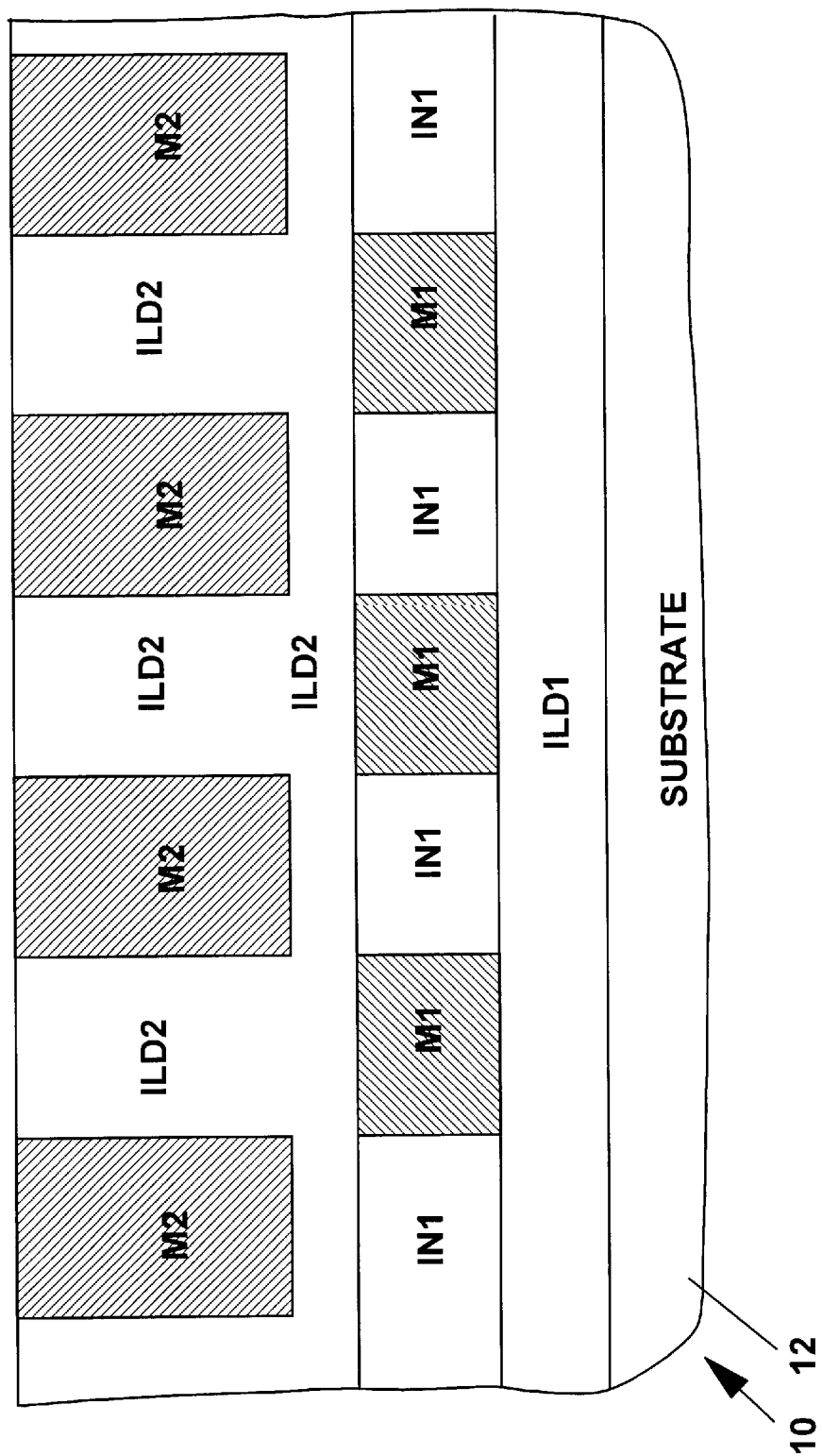
FIG. 4B shows the device of FIG. 4A after the photoresist mask PR has been removed, after which the intermediate lines were formed by a damascene process in the trenches in the second ILD layer followed by planarization.

FIGS. 4A–4B illustrate forming the intermediate lines M2 by a damascene process. First, as shown in FIG. 4A, an extra thick central ILD layer ILD2 was deposited over the lower lines M1 and the parallel stripes of the first insulator (dielectric) layer IN1 and planarized, followed by forming a mask PR with openings W1–W4 therethrough. Using the mask PR, trenches ST1–ST4 were etched in the central ILD layer ILD2 leaving a substantial thickness of the central ILD layer ILD2 at the bottom of the trenches ST1–ST4 to provide electrical separation of the lower lines M1 from the intermediate lines M2 to be formed in FIG. 4B. The trenches ST1–ST4 are aligned with the with the parallel stripes of the first insulator (dielectric) layer IN1 between the lower lines M1.

FIG. 4B shows the device of FIG. 4A after the photoresist mask PR has been removed, after which the intermediate lines M2 were formed by a damascene process in the trenches ST1–ST4 in the central ILD layer ILD2. It is desired for the intermediate lines M2, which are typically composed of the metallic conductor such as aluminum, copper, gold, silver, tungsten, or alloys thereof, to have a high aspect ratio (i.e. >2:1) to enhance the sidewall surface area of the conductor relative to the available horizontal layout area. The intermediate lines M2 may be clad with a conductive barrier layer, such as a metallic material selected from titanium (Ti), tantalum (Ta), tantalum nitride (TaN), or tantalum/tantalum nitride (Ta/TaN) (not shown) for improved process compatibility with a conformal capacitor dielectric to be formed subsequently. Since the metallic stripes of the intermediate lines M2 were formed by a damascene process, there are no slots S1–S5 between the metal wiring stripes formed by the intermediate lines M2. The device 10 of FIG. 4B has been planarized.

FIG. 5 shows the device 10 of FIG. 3 after the mask PR has been stripped leaving the parallel stripes of intermediate lines M2 exposed with the parallel slots S1, S2, S3, S4, and S5 therebetween. FIG. 5 also shows the device 10 of FIG. 4B after the central ILD layer ILD2 has been etched back using lines M2 as masks to form slots S1–S5 in the central ILD layer ILD2 between the metallic, intermediate lines M2. The etching of the slots S1–S5 is stopped when the level of the slots is even with the bottoms of the intermediate lines M2 so that a substantial thickness of the central ILD layer ILD2 remains, resulting in a structure substantially the same as that shown in FIG. 3A.

FIGS. 6A–6E describe the process of forming additional structures in accordance with this invention on top of the device 10 shown in FIG. 5.

In FIG. 6A, the device 10 of FIG. 5 is shown after a thin conformal capacitor dielectric layer CD (with a thickness between about 2 nm and about 25 nm) has been deposited into the slots S1–S5 covering the surfaces of the metal stripes formed by the intermediate lines M2 and the exposed surfaces of the central ILD layer ILD2 at the bottom of the slots S1–S5 thereby narrowing the slots S1–S5 line with the dielectric layer CD, the material of which is selected to provide a higher dielectric constant than silicon dioxide ($SiO_2$) and may consist of a material selected from the group consisting of silicon nitride ($Si_3N_4$), tantalum pentoxide ($Ta_2O_5$), zirconium oxide ($Zr_2O_5$), aluminum oxide ($Al_2O_3$) and barium strontium titanate ($BaSrTiO_3$) or other higher dielectric constant material.

A thin etch stop layer ES (with a thickness between about 2 nm and 10 nm), e.g. composed of silicon nitride (SiN), is then conformally deposited over the surface of the capacitor dielectric material CD leaving narrower slots ST1–ST5 lined with etch stop layer ES as shown in FIG. 6A.

Referring to FIG. 6B, the device 10 of FIG. 6A is shown after deposition and of an upper ILD layer ILD3 filling the slots ST1–ST5 and covering the etch stop layer ES. The device 10 of FIG. 6B has been planarized.

FIG. 6C shows the device 10 of FIG. 6B after performing several processing steps. First form a patterned hard or resist mask layer HM over planarized upper ILD layer ILD3 which is shown in FIG. 6C. Next exposed portions of upper ILD layer ILD3 are anisotropically etched away in a manner which is selective to the etch stop layer ES (e.g. SiN), stopping on the etch stop layer ES leaving it intact until the next step. That next step is to remove exposed portions of the etch stop layer ES, as shown by FIG. 6C with a short RIE where the etch stop layer ES is unprotected by the hard mask layer HM forming a set of parallel slots (trenches) SL1–SL5 between the intermediate lines M2 (and aside therefrom) which are coated with capacitor dielectric material CD. The removal of the etch stop layer ES at the bottom of the slots SL1–SL5 exposes the top surface of central ILD layer ILD2 at the bottom thereof.

Then anisotropic etching continues deeper into the bottom of the slots SL1–SL5 until the exposed portions of the central ILD layer ILD2 are removed over the lower lines M1, exposing clean top surfaces of the lower lines M1 at the bottom of the slots SL1–SL5.

The capacitor dielectric layer CD deposited previously is sufficiently thick that the desired capacitor dielectric thickness remains after the anisotropic RIE etching through the central ILD layer ILD2 which exposes the top surfaces of the lower lines M1 for electrical and mechanical connection which will subsequently be provided through a liner layer LI to the resistive studs ST1–ST3 which are to be formed as described below in connection with FIG. 6D.

As a result of the etching through to the lower lines M1, a substantial portion of the etch stop layer ES is removed. It is preferred that no etch stop layer ES remains over capacitor dielectric material, to maximize capacitance.

Referring to FIG. 6D, the device 10 of FIG. 6C is shown after the resist or hard mask layer HM has been removed and a conductive liner layer LI, composed of a material such as tantalum (Ta), titanium nitride (TiN), titanium/titanium nitride (Ti/Tin), tantalum silicon nitride (TaSiN) or tantalum/tantalum nitride (Ta/TaN), was conformally deposited in the open vias covering the exposed surfaces of the metal lines M1, the central ILD layer ILD2, the capacitor dielectric CD, and the third dielectric ILD3. The conductive liner layer LI prevents any adverse effects such as a chemical reaction between the capacitor dielectric CD and the subsequently deposited stud material of the resistive studs ST1–ST3. Such a chemical reaction could degrade the reliability of the capacitor dielectric CD or decrease the capacitance.

Then the resistive stud material (i.e. tungsten (W) or doped polysilicon) is deposited and planarized forming studs ST1–ST3 as shown filling the three slots SL2–SL4 between the liner layer LI, capacitor dielectric CD and the intermediate lines M2. The studs are formed of a material which preferably has a resistivity of from about five milli-ohm-centimeters to about ten milli-ohm-centimeters depending upon the frequency characteristics of the filter.

The device 10 of FIG. 6D has been planarized.

FIG. 6E shows the device 10 of FIG. 6D after a third metal wiring level has been formed and patterned into a set of parallel, upper lines M3, hereinafter referred to as the upper lines M3) extending back into the page in a direction parallel to both the lower lines M1 and the intermediate lines M2, but on a higher plane. The metal layer formed into upper lines M3 is deposited in blanket form over the upper ILD layer ILD3 and the top surfaces of the studs ST1–ST3 and is then patterned and defined using conventional methods such as the subtractive process steps described and illustrated above.

Alternatively, upper lines M3 could be formed using damascene process steps described and illustrated above by first depositing a fourth dielectric layer (not shown) over the upper ILD layer ILD3 and the top surfaces of the studs ST1–ST3, and then patterning and etching trenches in the fourth dielectric layer (not shown) which would subsequently be filled with the metal for the upper lines M3.

The upper lines M3 are in direct electrical/ mechanical contact with the studs ST1–ST3.

In an on-chip application, lower lines M1 may provide VDD (supply voltage) for one type of circuit (e.g. small signal analog) while upper lines M3 may provide VDD for digital circuits. Intermediate lines M2 are maintained at a second fixed potential (e.g. ground). The distributed resistive-capacitive slotted line provides a low-pass decoupling network between the VDD lines M3 for chip circuits that must be isolated from each other. Note that the lower lines M1, intermediate lines M2, and upper lines M3 and the resistive studs ST1–ST3 all run parallel to each other back into the page. This configuration provides a specific RC value (since the RC product is independent of the length of the line) for RF filtering, while allowing very low Direct Current (DC) resistance between small circuit VDD lower lines M1 and digital VDD upper lines M3 (since the resistance is inversely proportional to the length of the line).

FIG. 7 shows an "x-ray" plan view of the device 10 shown in FIG. 6E, with only the metal structures M1, M2, M3 and ST1–ST3 visible. The three lower lines M1 are shown on the bottom, covered by the three upper lines M3, with intermediate lines M2 aside therefrom and therebetween. The studs ST1, ST2 and ST3 overlie respective stacks of lower lines M1 and upper lines M3 Section line 6E—6E' in FIG. 7 indicates a cross section line through which FIGS. 6A–6E are taken. Section line 8—8' in FIG. 7 indicates a cross section line through which FIG. 8 is taken.

FIG. 8 is a sectional elevational view of device 10 of FIG. 6E taken along line 8—8' in FIG. 7 showing device 10 with the substrate 12 covered by the lower ILD ILD1, upon which a lower line M1 is shown covered by the stud ST2 which is covered in turn by the corresponding upper line M3.

Equivalent Circuit of Resistive Stud ST2

Figure 9:
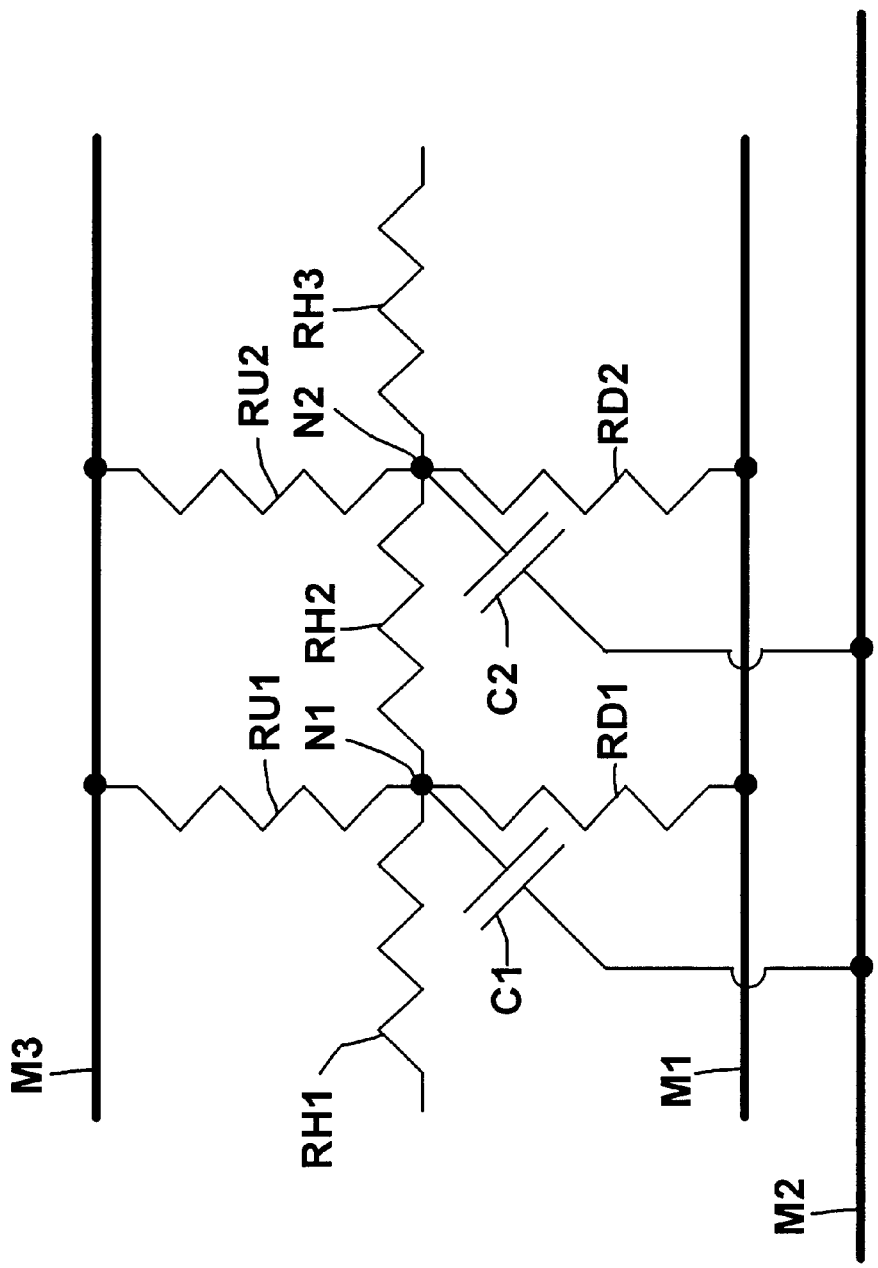
FIG. 9 shows an electrical equivalent circuit of the structure of FIGS. 6E, 7 and 8.

FIG. 9 shows an electrical equivalent circuit of a slice through the stud ST2 of the device 10 of FIGS. 6E, 7 and 8. Three of the metal lines M1, M2 and M3 are shown to illustrate the equivalent circuit RC elements distributed along a stud ST2 which is representative of studs ST1 and ST3. In the equivalent circuit, metal lines M1, M2 and M3 are represented as perfect conductors since their resistance is negligible relative to the distributed resistance of the studs ST1, ST2 and ST3. The stud ST2 is assumed to be composed of an infinite series of resistive segments, three of which RH1, RH2 and RH3 are shown here, which account for resistance along the length of the stud ST2. The effective nodes N1 and N2, which represent two of an infinite number of effective nodes, show the capacitive and resisitive connections between two internal points within the stud ST2 and the lines M1, M2 and M3. There are equivalent circuit resistances RU1 and RU2 from nodes N1 and N2 reaching up to the upper line M3. Similarly, there are equivalent circuit resistances RD1 and RD2 reaching down from nodes N1 and N2 to a lower line M1. Line M2 is connected by effective capacitors C1 and C2 to effective nodes N1 and N2 respectively. The capacitors C1 and C2 are formed across the liner layer LI and the capacitor dielectric layer CD described above and as shown in FIG. 6E between the studs ST1–ST3 and intermediate lines M2 on either side thereof. While the lower line M1 is connected directly to the lower end of the resistive stud ST2, since stud ST2 is resistive, the nodes N1 and N2 are separated therefrom by resistors RD1 and RD2. Similarly, while the upper line M3 is connected directly to the upper end of the resistive stud ST2, since stud ST2 is resistive, the nodes N1 and N2 are separated therefrom by resistors RU1 and RU2.

Second Embodiment
RIE Patterning of M2 ILD/M2/M3 ILD

FIGS. 10A–10D illustrate a process for forming a device 20 formed on a substrate 22 in accordance with this invention with the arrays of lower lines M1 and upper lines M3 extending transversely relative to the page and the intermediate M2 lines extending at right angles to the page above the lower ILD layer ILD1 on top of substrate 22.

Figure 10A:
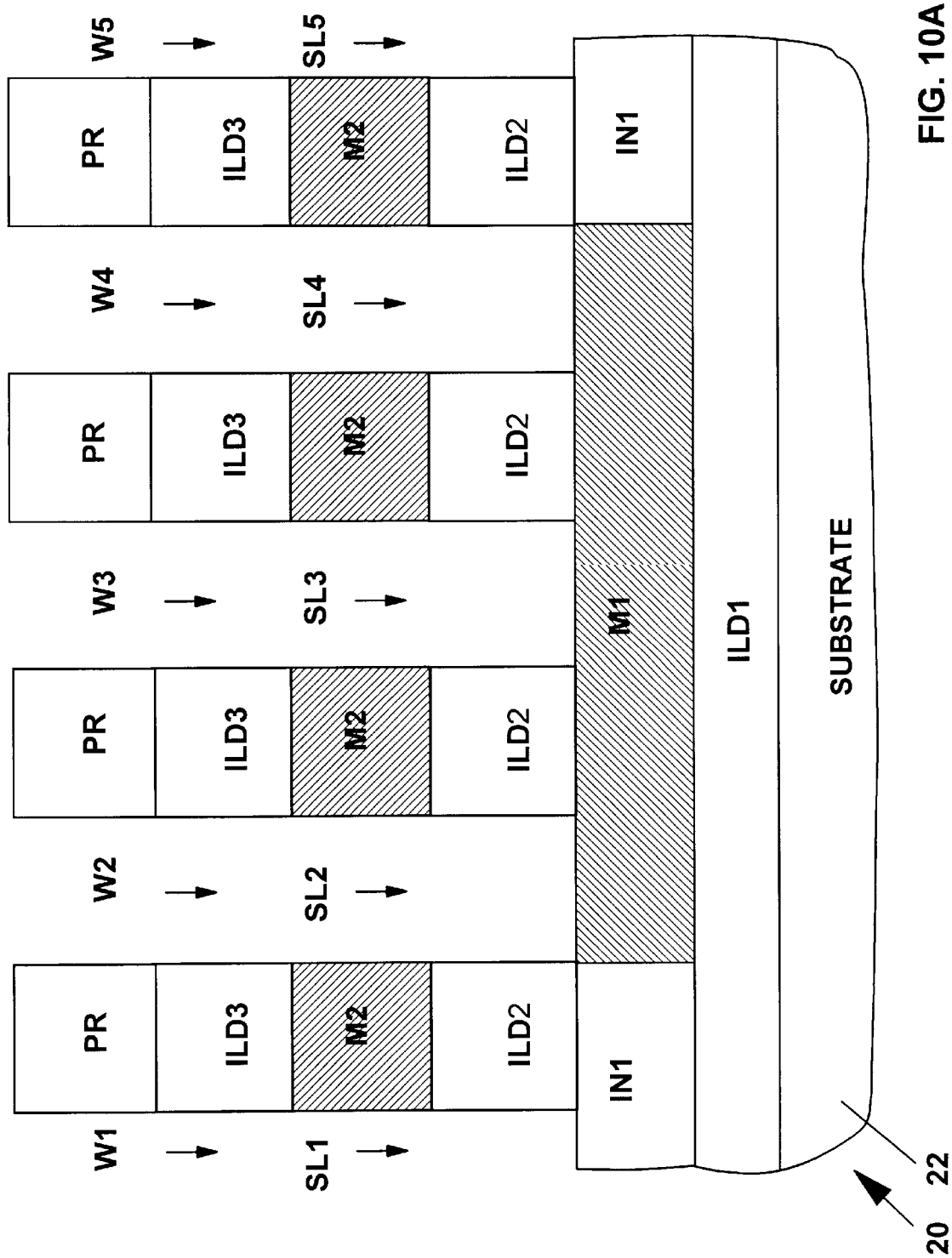
FIGS. 10A–10D illustrate a process for forming a device on a substrate in accordance with this invention with the arrays of lower wiring lines and upper wiring lines extending transversely relative to the page and the intermediate wiring lines extending at right angles to the page above the lower ILD layer on top of substrate.

FIG. 10A shows a device 20 after forming lower ILD layer ILD1 on top of substrate 22 covered by a first ILD layer ILD1. The substrate 22 may be a semiconductor structure upon which other wiring layers (not shown) have been formed. A metallic, lower line M1 and the first insulator (dielectric) layer IN1 have been formed over the first ILD layer ILD1 by a damascene or subtractive etch process thereby forming a lower line M1 which runs from right to left within the layer IN1 with the types of processing steps described above with respect to the first embodiment. The lower lines M1 may be formed in an array of parallel stripes surrounded by the dielectric layer ILD1, with the lower lines M1 and the first ILD layer ILD1 having been planarized.

Then a blanket central ILD layer ILD2 is deposited covering the previously planarized first ILD layer ILD1 and lower lines M1. Then form vias (not shown) for wiring outside the decoupling region. Deposit a blanket layer of the second layer of metal M2, and a blanket layer of third dielectric layer ILD3.

Next, employing photolithography, cover the layer ILD3 with a photoresist mask and form therefrom as mask with parallel strips PR reaching back into the page (with windows W1–W5 therethrough) covering layer ILD3. Then employ etching through the windows W1–W5 in the mask PR4 by a process such as RIE to form parallel slots SL1–SL5 (extending into the page) down to the top surface of the line M1 and exposed surfaces of the first insulator (dielectric) layer IN1 (not shown in the cross section shown in FIGS. 10A–10D). The parallel slots SL1–SL5 provide space for the plugs ST1–ST3 seen in FIGS. 10C–10D.

Figure 10B:
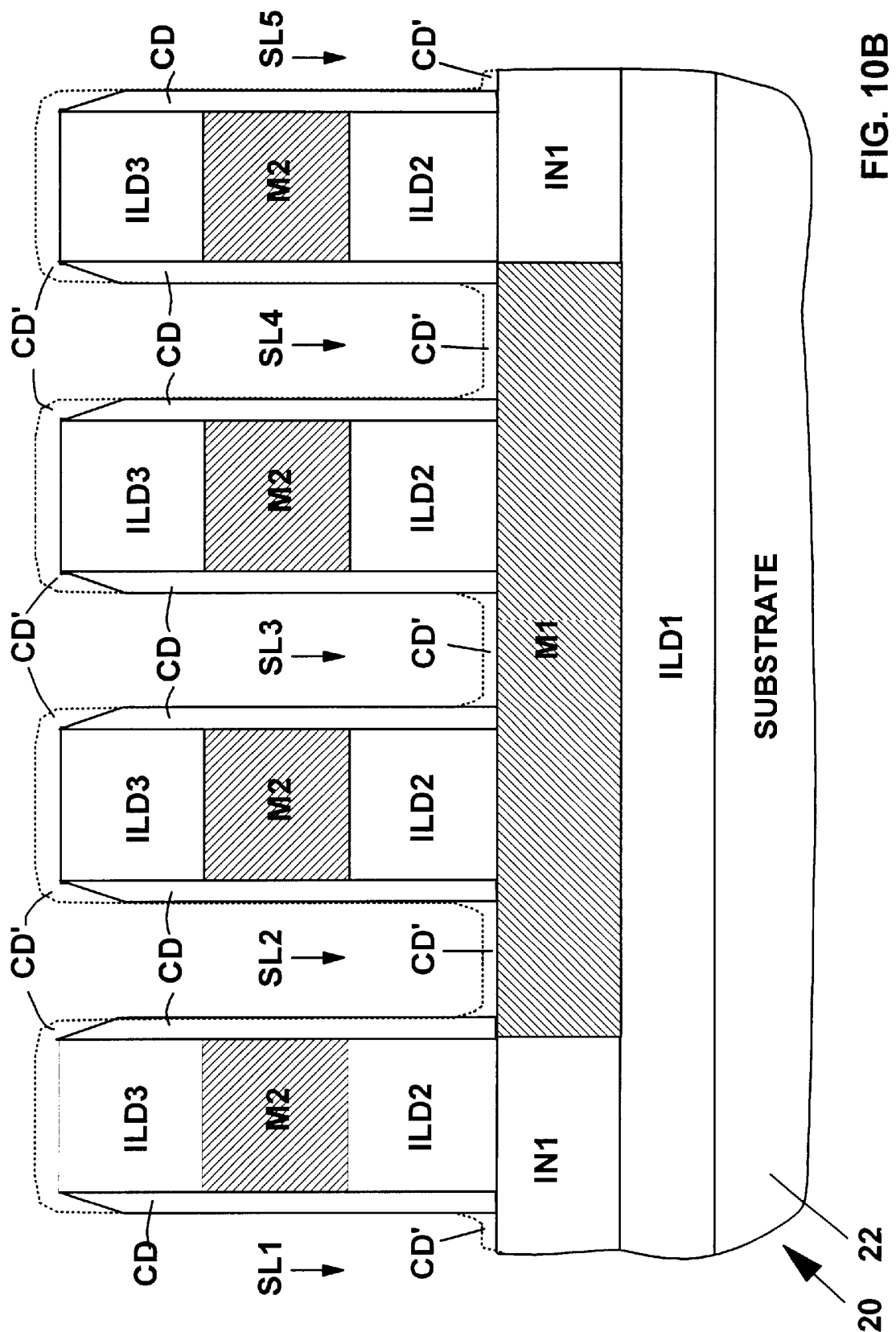

FIG. 10B shows the device 20 of FIG. 10A after depositing a conformal, blanket capacitor dielectric layer CD/CD' (e.g. $Ta_2O_5$, SiN) covering the exposed top surfaces of the lower line M1 and exposed surfaces of the first insulator (dielectric) layer IN1 as well as the sidewalls of layers ILD2/M2/ILD3. Then the dielectric layer CD/CD' was anisotropically etched back to form spacers CD by RIE (with a thickness between about 2.5 nm and 25 nm ) removing the portions CD' of dielectric layer CD on both the horizontal top surfaces (shown in phantom) and the horizontal bottom surfaces (also shown in phantom).

Figure 10C:
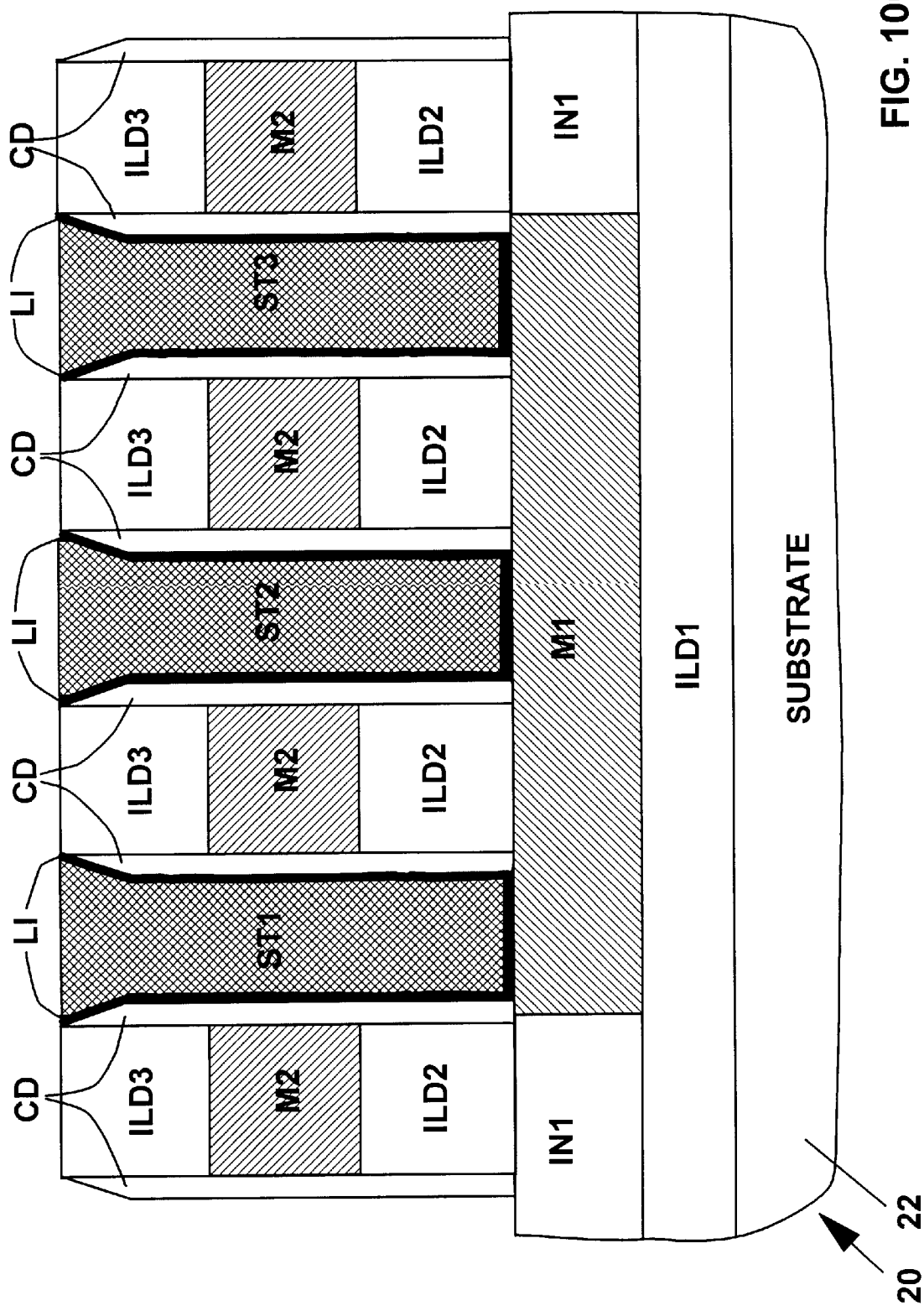

FIG. 10C shows the device 20 of FIG. 10B after forming the liner layers LI and resistive studs ST1, ST2, ST3 (e.g. W, TiN, $WSi_2$) as described in connection with FIG. 6D above and planarize by CMP. In addition, form vias to M2 (not shown) for wiring outside the decoupling region.

Figure 10D:
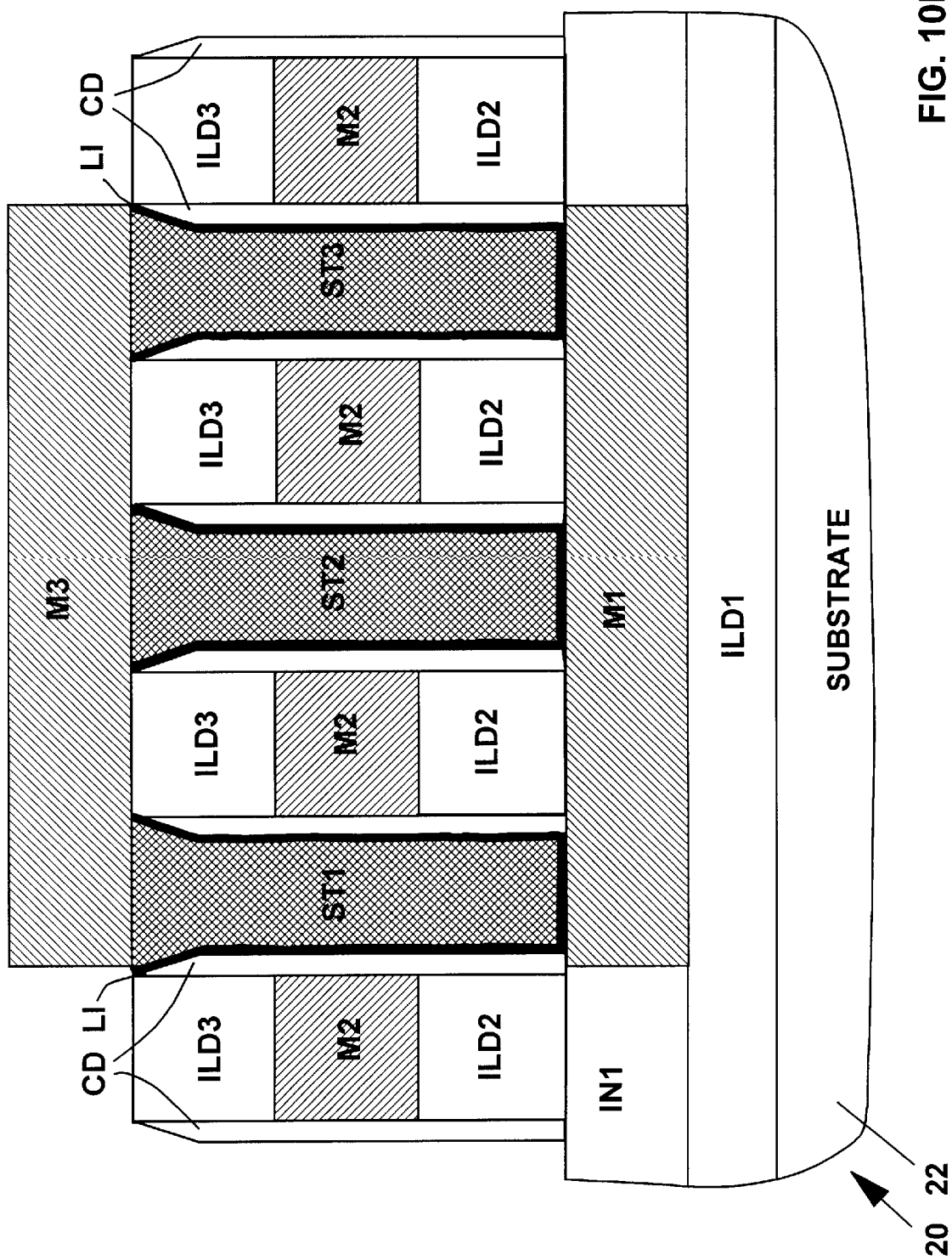

FIG. 10D shows the device 20 of FIG. 10C after forming an array of metal lines M3 transverse to the page on the top surface of the substrate 22, above the top surfaces of the studs ST1–ST3 and the top surfaces of the upper ILD layer ILD3. The method of depositing and patterning metal lines M3 may be a subtractive or damascene technique as described above.

Third Embodiment
Dual Damascene

FIGS. 11A–11G illustrate a dual damascene process for forming a device 30 in accordance with this invention with the arrays of lines M1 and M3 transverse to the page and the M2 lines extending into the page above the lower ILD layer ILD1 on top of substrate 32.

Figure 11A:
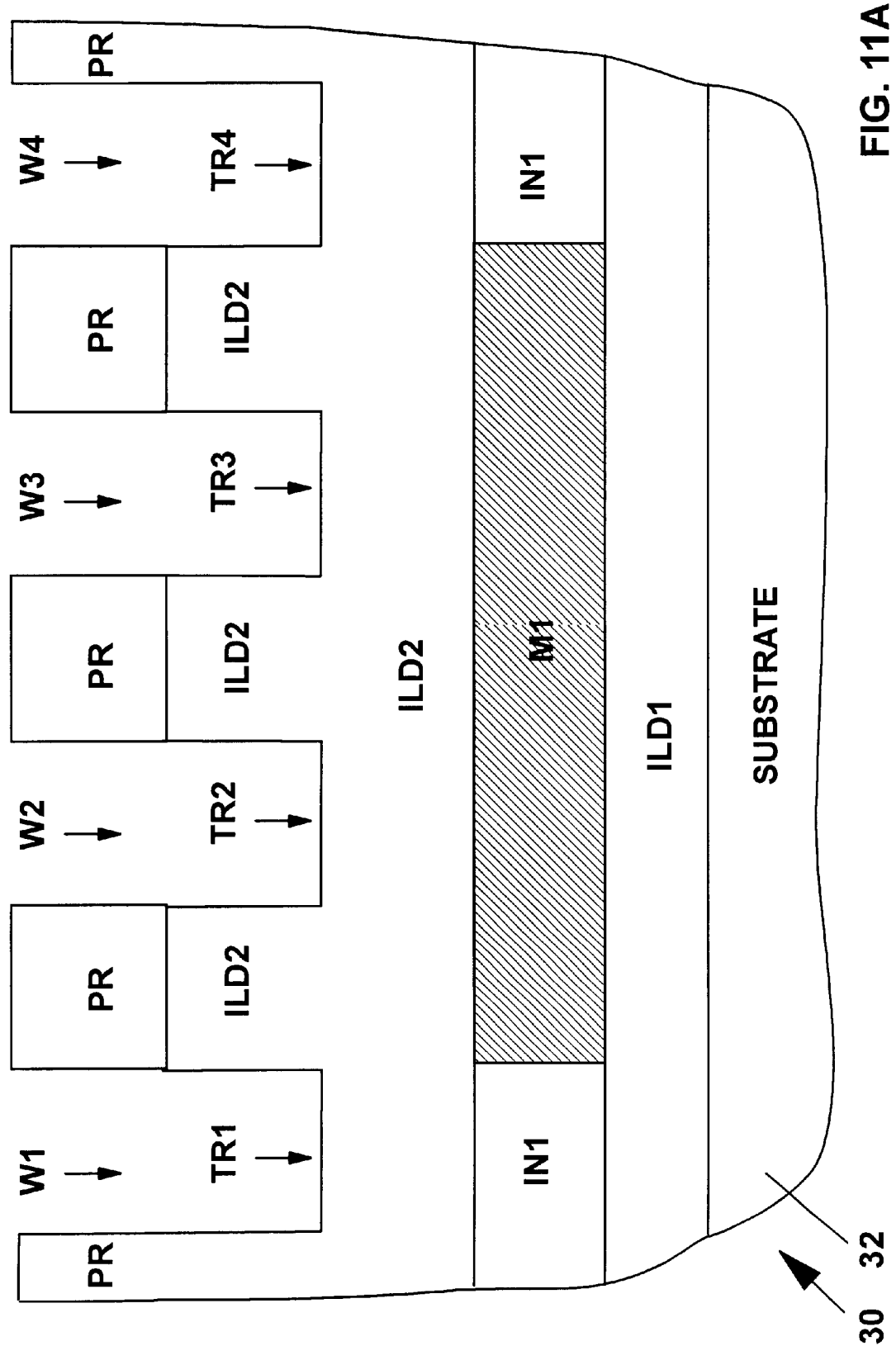
FIGS. 11A–11G illustrate a dual damascene process for forming a device in accordance with this invention with the arrays of lower wiring lines and upper wiring lines transverse to the page and the intermediate wiring lines extending into the page above the lower ILD layer on top of the substrate.

FIG. 11A shows a device 30 after forming lower ILD layer ILD1 on top of substrate 32. The substrate 32 may consist of a semiconductor substrate upon which other wiring layers (not shown) have been formed. A metallic, lower line M1 which runs from right to left on the drawing and the first insulator (dielectric) layer IN1 have been formed over lower ILD layer ILD1 by a damascene or subtractive etch process thereby forming a first metal line M1 which runs from right to left within the layer IN1 with the types of processing steps described above. Lower lines M1 may be formed in an array of parallel strips of the lower lines M1 surrounded by the dielectric layer ILD1, with metal lines M1 and layer ILD1 having been planarized.

Then deposit a thick blanket layer of the central ILD layer ILD2 that covers the previously planarized dielectric layer ILD1 and metal lines M1. The central ILD layer ILD2 should be about as thick as the layers ILD2 and M2 in FIG. 10A to yield a similar structures of central ILD layer ILD2 and intermediate line M2 to those produced in FIG. 10D. Then form vias (not shown) for wiring outside the decoupling region.

Formation of Second Metallization Layer and VIAs in Dual Damascene Process

Next, form a photoresist mask PR with a parallel array of windows W1–W4 extending back into the page over the central ILD layer ILD2 (for providing space for the intermediate lines M2). Then through the access provided by the windows W1–W5 perform an etching step to form the trenches TR1–TR4 extending into the page transverse to the lines M1 which extend to a depth suitable for forming the intermediate lines M2, with a similar depth to that shown in FIG. 4A.

Figure 11B:
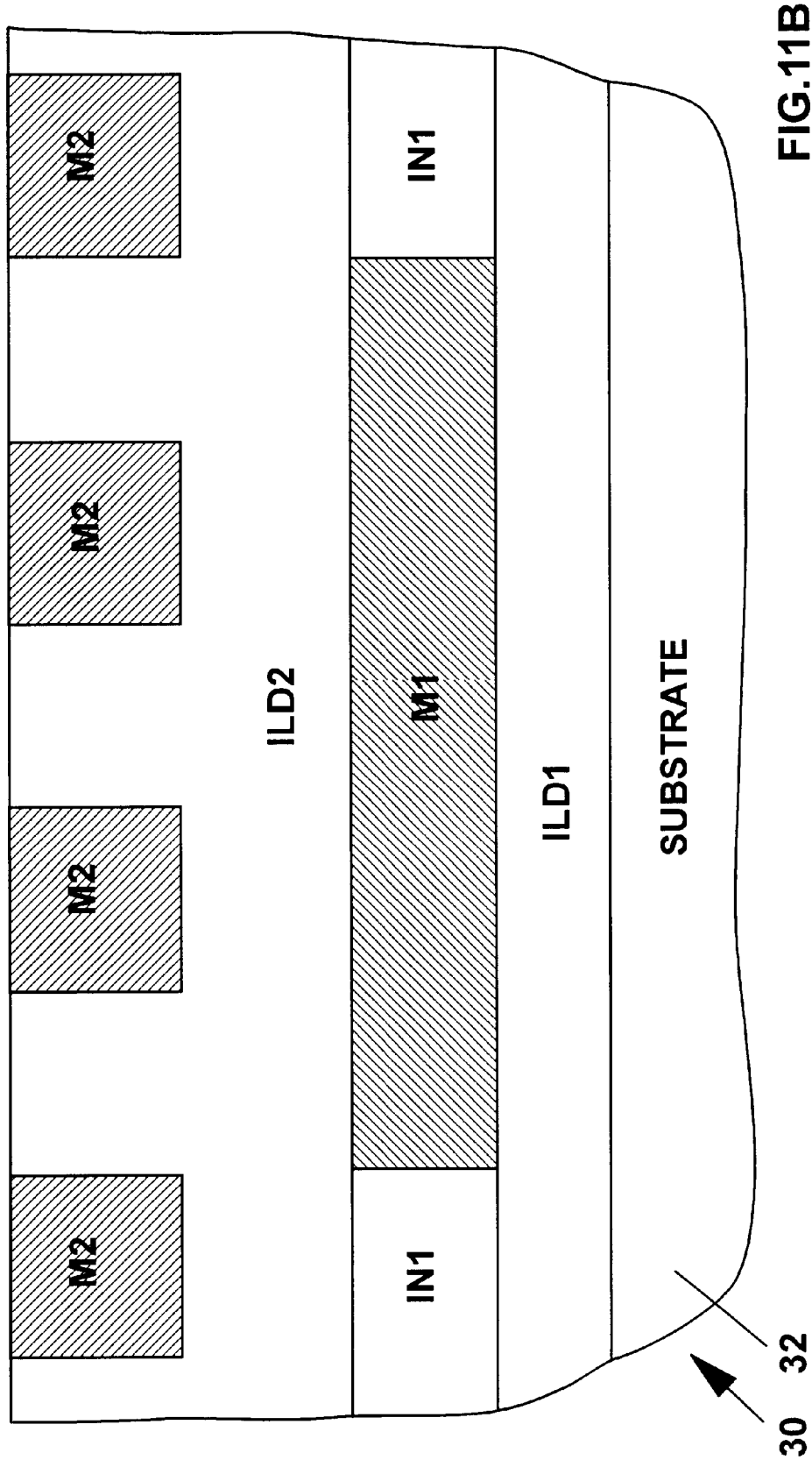

Then in FIG. 11B, the device 30 of FIG. 11A is shown following removal of the photoresist mask PR aside from and between the metal lines followed by a dual damascene process of filling the trenches TR1–TR4 with the intermediate lines M2. The intermediate lines M2 have been planarized to produce a flat surface with the central ILD layer ILD2 top surfaces being on the same plane. The VIAs are formed for wiring outside the decoupling region during this interval as will be understood by those skilled in the art in a parallel damascene set of steps (not shown for convenience of illustration).

Figure 11C:
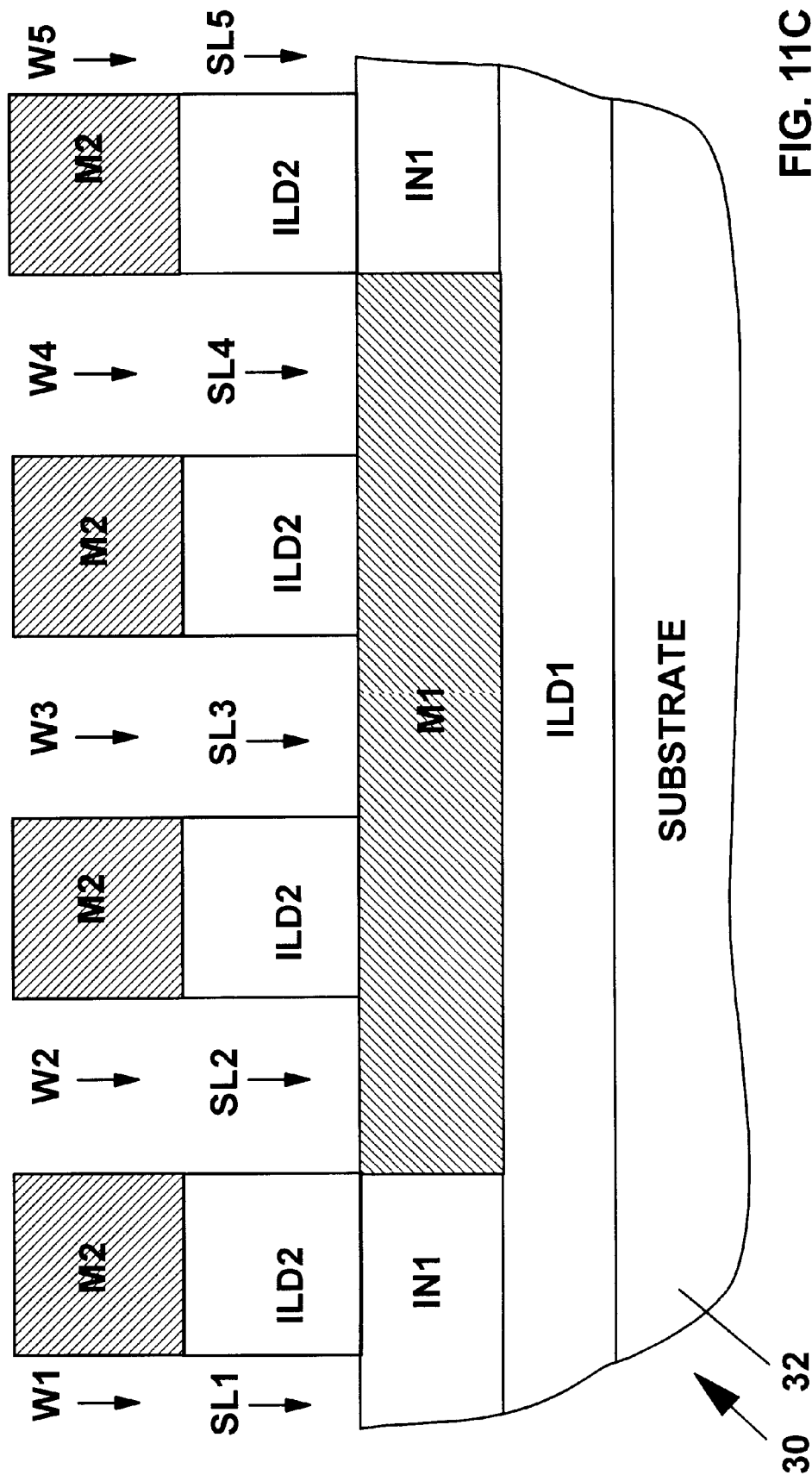

Then in FIG. 11C, the device 30 of FIG. 11B is shown following etching through the windows W1–W5 between the intermediate lines M2 etching back the central ILD layer ILD2. The intermediate lines M2 which serve as masks to form self-aligned slots SL1–SL5 that extend down to the top surfaces of the lower lines M1 and insulator layer IN1. In addition, a block mask is used aside from the region shown on the drawing to avoid shorting to the M1 signal lines where no studs are to be formed as shown in FIG. 1D.

To avoid etching the first insulator layer IN1, a timed etch through the central ILD layer ILD2 can be used to assure that negligible etching into the first insulator layer IN1 occurs. Alternatively, another thin etch stop layer, e.g. silicon nitride, can be deposited over the first insulator layer IN1 and the lower lines M1 prior to deposition of the central ILD layer ILD2. This additional etch stop layer assures that etching through the central ILD layer ILD2 does not continue into the first insulator layer IN1. Another alternative is to employ a mask over windows W1 AND W5 to prevent etching of the first insulator layer IN1.

Figure 11D:
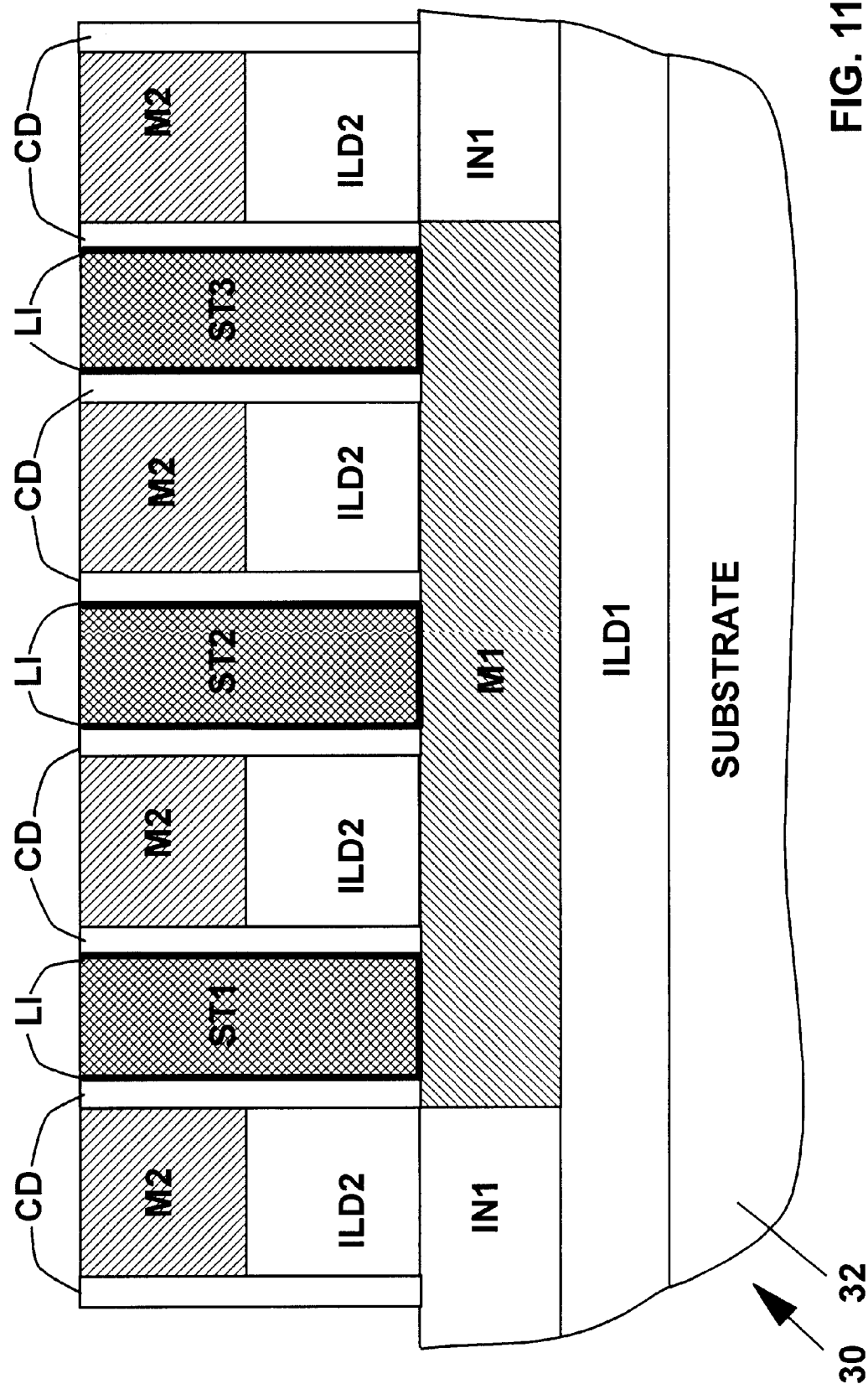

FIG. 11D shows the device 30 of FIG. 11C after depositing capacitor dielectric layer CD in the slots SL1–SL5 and depositing liner layers LI on the sidewalls and the bottoms of the narrowed slots SL1–SL5 and depositing lower studs ST1–ST3 (preferably composed of tungsten (W)) into the narrowed slots SL1–SL5 and then device 30 was planarized. The first processing step employed was to etch back the capacitor dielectric layer CD anisotropically by RIE to form spacers on the sidewalls of the intermediate lines M2 and the central ILD layer ILD2. The etching back reexposed the top surfaces of the lower lines M1 at the bottom of the narrowed slots SL1–SL5. The next step was to deposit liner layers LI on the sidewalls and the bottoms of the narrowed slots SL1–SL5. Then as in the previous embodiments, studs ST1–ST3 were deposited into the narrowed slots SL1–SL5 followed by planarization by CMP.

Figure 11E:
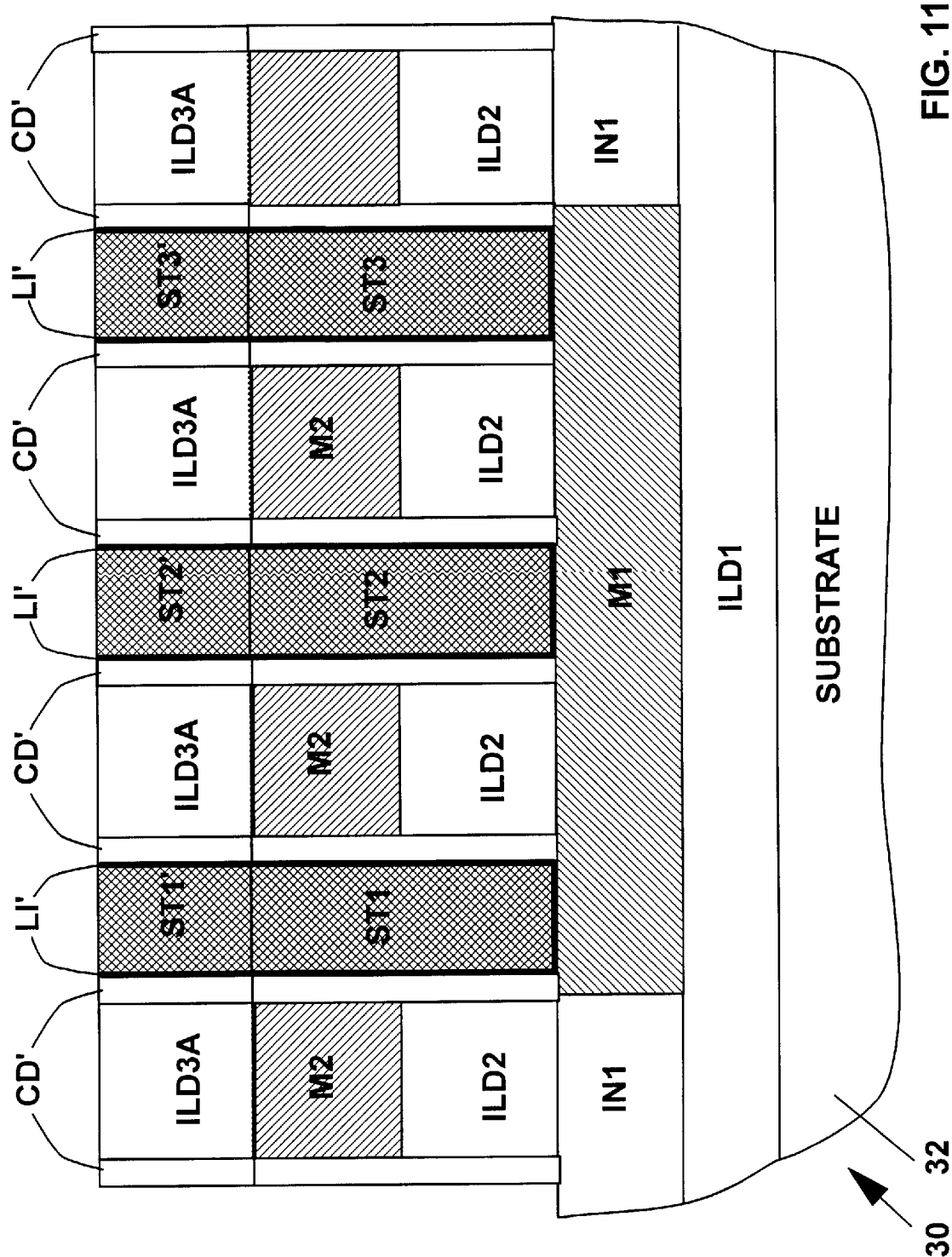

FIG. 11E shows the device 30 of FIG. 11D after depositing the lower half of upper ILD layer ILD3A, patterning slots (not shown) for connection to lower studs ST1–ST3 ST3 (and therethrough to lower lines M1). Then form capacitor spacers CD' above spacers CD, form liner layers LI' above liner layers LI, and fill the slots with a set of upper studs ST2'–ST3' tungsten (W) (preferably composed of tungsten (W)) with steps analogous those described above in connection with FIG. 11D.

Figure 11F:
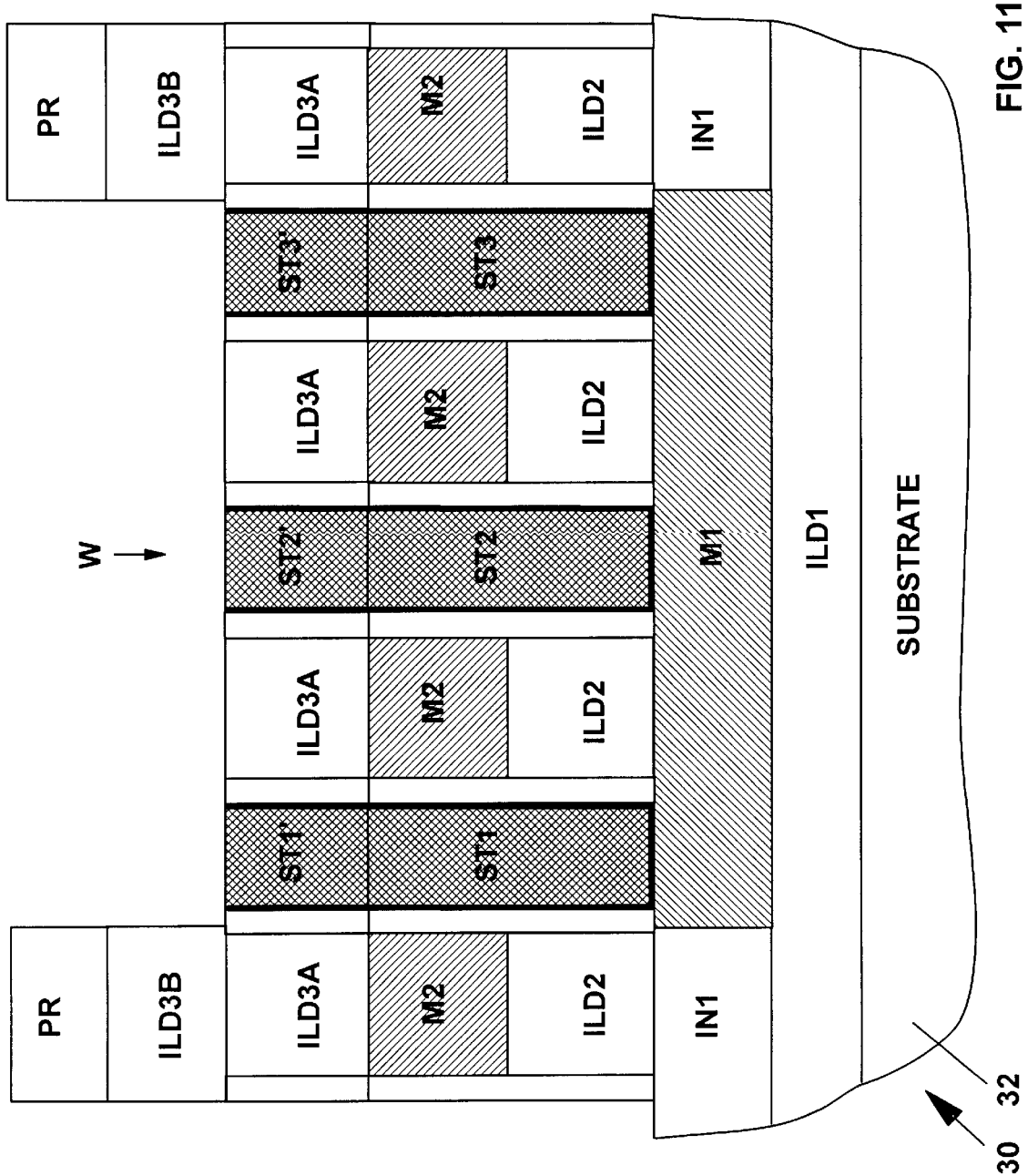

FIG. 11F shows the device 30 of FIG. 11E after performing a damascene process in which an upper half of upper ILD layer ILD3B has been deposited and patterned over the lower half of upper ILD layer ILD3A.

Figure 11G:
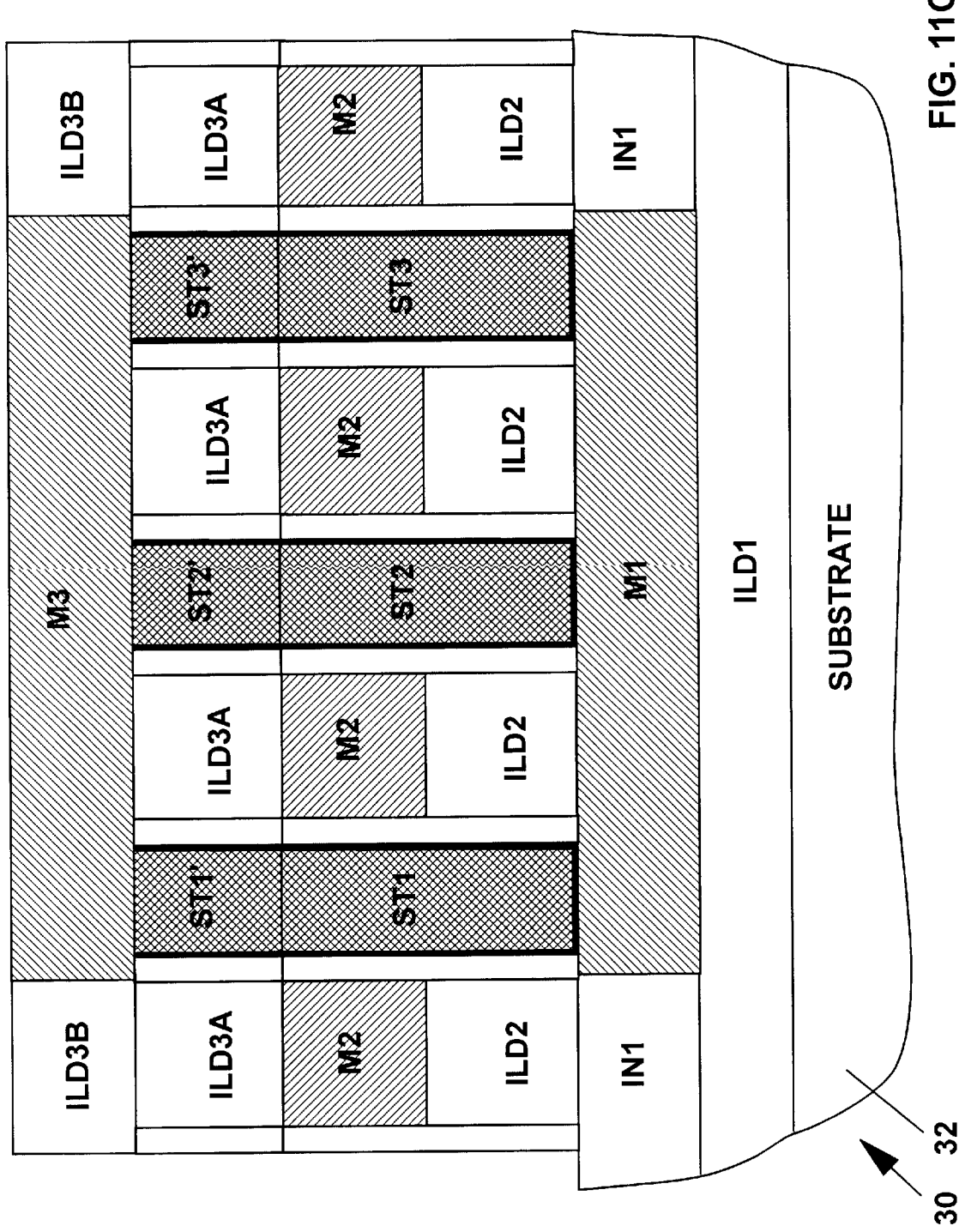

FIG. 11G shows the device 30 of FIG. 11F after forming the upper line M3 and vias (not shown) by a dual damascene process.

This type of circuit can be employed in semiconductor technologies including CMOS/SOI & bulk, bipolar, GaAs, etc..

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device including interconnected conductor lines comprising:
   a plurality of lower conductor lines formed on a lower level each having a top surface,
   a plurality of resistive studs having sidewalls, lower ends and upper ends, each resistive stud being formed over the top surface of a lower conductor line in electrical and mechanical contact therewith at the lower end thereof,
   a plurality of intermediate conductor lines formed laterally between the resistive studs, with each intermediate conductor line being separated from each adjacent stud by a capacitor dielectric layer,
   a plurality of the upper conductor lines formed on an upper level each having a lower surface in contact with the upper end of a corresponding one of the resistive studs, and
   dielectric material formed about the intermediate conductor for electrically insulating and separating the intermediate conductor lines from the lower conductor lines and the upper conductor lines.

2. The device of claim 1 wherein the resistive stud is formed from a material selected from the group consisting of tungsten, tungsten silicide and doped polysilicon.

3. The device of claim 1 wherein the resistive stud is separated from the capacitor dielectric layer by a liner layer composed of a material selected from the group consisting of tantalum, titanium nitride, titanium/titanium nitride, tantalum silicon nitride, and tantalum/tantalum nitride.

4. The device of claim 1 wherein the capacitor dielectric layer is composed of a material selected from the group consisting of silicon nitride, tantalum pentoxide, zirconium oxide, aluminum oxide and barium strontium titanate.

5. The device of claim 1 wherein:
the resistive stud is formed from a material selected from the group consisting of tungsten, tungsten silicide and doped polysilicon, and
the resistive stud is separated from the capacitor dielectric layer by a liner layer composed of a material selected from the group consisting of tantalum, titanium nitride, titanium/titanium nitride, tantalum silicon nitride and tantalum/tantalum nitride.

6. The device of claim 1 wherein:
each resistive stud is separated from the capacitor dielectric layer by a liner layer composed of a material selected from the group consisting of tantalum, titanium nitride, titanium/titanium nitride, tantalum silicon nitride and tantalum/tantalum nitride, and
the capacitor dielectric layer is composed of a material selected from the group consisting of silicon nitride, tantalum pentoxide, zirconium oxide, aluminum oxide and barium strontium titanate.

7. The device of claim 1 wherein:
each resistive stud is formed from a material selected from the group consisting of tungsten, tungsten silicide and doped polysilicon,
each resistive stud is separated from the capacitor dielectric layer by a liner layer composed of a material selected from the group consisting of tantalum, titanium nitride, titanium/titanium nitride, tantalum silicon nitride and tantalum/tantalum nitride, and
the capacitor dielectric layer is composed of a material selected from the group consisting of silicon nitride, tantalum pentoxide, zirconium oxide, aluminum oxide and barium strontium titanate.

8. The device of claim 1 wherein the lower conductive lines, the intermediate conductive lines, and the upper conductive lines and the resistive studs are formed in parallel arrays.

9. The device of claim 1 wherein
the intermediate conductive lines and the resistive studs are formed in parallel arrays, extending in a first direction and
the lower conductive lines and the upper conductive lines are formed in parallel arrays extending transversely with respect to the first direction.

10. The device of claim 1 wherein
the intermediate conductive lines and the resistive studs are formed in parallel arrays, extending in a first direction,
the lower conductive lines and the upper conductive lines are formed in parallel arrays extending transversely with respect to the first direction, and
at least some of the conductive lines comprise damascene conductive lines.

11. A semiconductor device including interconnected conductor lines comprising:
a lower Interlayer Dielectric (ILD) layer having a top surface formed on a substrate,
a plurality of lower conductor lines being formed on the top surface of the lower ILD layer and being surrounded by an insulator layer which is also formed on the top surface of the lower ILD layer, each of the lower conductor lines and the insulator layer having a top surface,
a plurality of resistive studs having sidewalls, lower ends and upper ends, with each resistive stud being formed over the top surface of lower conductor line in electrical and mechanical contact therewith at the lower end thereof,
a plurality of intermediate conductor lines formed laterally between the resistive studs, with each intermediate conductor line being separated from each adjacent stud by a liner layer and a capacitor dielectric layer,
a plurality of upper conductor lines formed on an upper level each having a lower surface in contact with the upper end of a corresponding one of the resistive studs,
a central ILD layer below the intermediate conductor for electrically insulating and separating the intermediate conductor lines from the lower conductor lines, and
an upper ILD layer above the intermediate conductor for electrically insulating and separating the intermediate conductor lines from the upper conductor lines.

12. The device of claim 11 wherein each resistive stud is formed from a material selected from the group consisting of tungsten, tungsten silicide and doped polysilicon.

13. The device of claim 11 wherein each resistive stud is separated from the capacitor dielectric layer by the liner layer composed of a material selected from the group consisting of tantalum, titanium nitride, titanium/titanium nitride, tantalum silicon nitride and tantalum/tantalum nitride.

14. The device of claim 11 wherein the capacitor dielectric layer is composed of a material selected from the group consisting of silicon nitride, tantalum pentoxide, zirconium oxide, aluminum oxide and barium strontium titanate.

15. The device of claim 11 wherein:
each resistive stud is formed from a material selected from the group consisting of tungsten, tungsten silicide and doped polysilicon, and
each resistive stud is separated from the capacitor dielectric layer by the liner layer composed of a material selected from the group consisting of tantalum, titanium nitride, titanium/titanium nitride, tantalum silicon nitride and tantalum/tantalum nitride.

16. The device of claim 11 wherein each resistive stud is formed from a material selected from the group consisting of tungsten, tungsten silicide and doped polysilicon, and
the capacitor dielectric layer is composed of a material selected from the group consisting of silicon nitride, tantalum pentoxide, zirconium oxide, aluminum oxide and barium strontium titanate.

17. The device of claim 11 wherein:
each resistive stud is formed from a material selected from the group consisting of tungsten, tungsten silicide and doped polysilicon,
each resistive stud is separated from the capacitor dielectric layer by a liner layer composed of a material selected from the group consisting of tantalum, titanium nitride, titanium/titanium nitride, tantalum silicon nitride and tantalum/tantalum nitride, and
the capacitor dielectric layer is composed of a material selected from the group consisting of silicon nitride, tantalum pentoxide, zirconium oxide, aluminum oxide and barium strontium titanate.

18. The device of claim 11 wherein the second conductive line has a high aspect ratio.

19. The device of claim 11 wherein the capacitor formed by the resistive stud, the capacitor dielectric, and the intermediate conductor across the capacitor dielectric layer and the liner layer form an electrically porous, distributed resistive-capacitive low-pass decoupling network.

20. A method of forming a semiconductor device including interconnected conductor lines comprising:

forming a lower Interlayer Dielectric (ILD) layer having a top surface formed on a substrate, forming a plurality of lower conductor lines formed on the top surface of the lower ILD layer which are surrounded by an insulator layer that is also formed on the top surface of the lower ILD layer, each of the lower conductor lines and the insulator layer having a top surface, forming a plurality of resistive studs having sidewalls, lower ends and upper ends, each resistive stud being formed over the top surface of lower conductor line in electrical and mechanical contact therewith at the lower end thereof, forming a plurality of intermediate conductor lines formed laterally between the resistive studs, with each conductor line being separated from each adjacent stud by a liner layer and a capacitor dielectric layer, forming a plurality of upper conductor lines formed on an upper level each having a lower surface in contact with the top surface of a corresponding one of the resistive studs, forming a central ILD layer below the intermediate conductor for electrically insulating and separating the intermediate conductor lines from the lower conductor lines, and forming an upper ILD layer above the intermediate conductor for electrically insulating and separating the intermediate conductor lines from the upper conductor lines.

* * * * *